US008993216B2

(12) United States Patent
Ara et al.

(10) Patent No.: US 8,993,216 B2
(45) Date of Patent: Mar. 31, 2015

(54) METHOD OF PRODUCING A PLANOGRAPHIC PRINTING PLATE

(71) Applicant: FUJIFILM Corporation, Tokyo (JP)

(72) Inventors: Yoichiro Ara, Shizuoka-ken (JP); Shigekatsu Fujii, Shizuoka-ken (JP); Norio Aoshima, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/773,622

(22) Filed: Feb. 21, 2013

(65) Prior Publication Data

US 2013/0260317 A1 Oct. 3, 2013

(30) Foreign Application Priority Data

Mar. 30, 2012 (JP) ................................ 2012-082560

(51) Int. Cl.

| | |
|---|---|
| ***B41M 5/00*** | (2006.01) |
| ***B41N 1/00*** | (2006.01) |
| ***G03F 7/00*** | (2006.01) |
| ***G03F 7/20*** | (2006.01) |
| ***B41C 1/10*** | (2006.01) |

(52) U.S. Cl.

CPC ................ *G03F 7/20* (2013.01); *B41C 1/1008* (2013.01); *B41C 1/1016* (2013.01); *B41N 1/003* (2013.01); *B41C 2210/02* (2013.01); *B41C 2210/06* (2013.01); *B41C 2210/14* (2013.01); *B41C 2210/24* (2013.01); *B41C 2201/04* (2013.01); *B41C 2201/14* (2013.01); *B41C 2210/22* (2013.01); *B41C 2210/26* (2013.01); *B41C 2210/262* (2013.01)

USPC ......................... 430/302; 101/450.1; 101/453

(58) Field of Classification Search

CPC B41C 1/1016; B41C 1/1008; B41C 2201/02; B41C 2201/04; G03F 7/20; G03F 7/11; G03F 7/0395

USPC ..................... 430/270.1, 302; 101/453, 463.1

See application file for complete search history.

(56) References Cited

U.S. PATENT DOCUMENTS

| | | | | |
|---|---|---|---|---|
| 7,297,465 | B2 * | 11/2007 | Van Aert et al. ........... | 430/271.1 |
| 2004/0063036 | A1 * | 4/2004 | Takamiya ..................... | 430/302 |
| 2006/0057493 | A1 * | 3/2006 | Kakino et al. ............. | 430/270.1 |
| 2011/0200943 | A1 * | 8/2011 | Aoshima ....................... | 430/302 |
| 2013/0255516 | A1 * | 10/2013 | Fujii ............................ | 101/453 |

FOREIGN PATENT DOCUMENTS

| | | |
|---|---|---|
| JP | 2005-181963 A | 7/2005 |
| JP | 2005-53487 A | 2/2006 |

OTHER PUBLICATIONS

Extended European Search Report dated Jul. 30, 2013 from the EPO in an European patent application corresponding to the instant patent application.

* cited by examiner

*Primary Examiner* — Chanceity Robinson
(74) *Attorney, Agent, or Firm* — Solaris Intellectual Property Group, PLLC

(57) ABSTRACT

A method for producing a planographic printing plate is provided, which includes: subjecting a planographic printing plate precursor to image-wise exposure, wherein the precursor includes plural recording layers at least one of which contains (A) an infrared absorbing agent on a support, the upper recording layer contains (B) a water-insoluble and alkali-soluble polymer compound having a repeating unit containing a fluoroalkyl group or a siloxane structure; and developing the precursor using an alkali developer containing (C)an ammonium salt compound of Formulae (C-1) to (C-3), wherein $R^1$ represents a methyl group or an ethyl group, $R^2$ and $R^3$ represent a hydrocarbon group having 3 to 20 carbon atoms, $R^4$ represents a hydrocarbon group, A represents an atomic group which forms a nitrogen-containing aliphatic ring with $N^+$, B represents an atomic group which forms a nitrogen-containing aromatic ring with $N^+$, and $X^-$represents a counter anion.

(C-1)

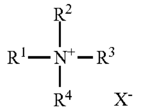

(C-2)

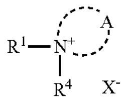

(C-3)

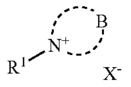

9 Claims, No Drawings

METHOD OF PRODUCING A PLANOGRAPHIC PRINTING PLATE

CROSS-REFERENCE TO RELATED APPLICATION

This application claims priority under 35 USC 119 from Japanese Patent Application No. 2012-082560 filed on Mar. 30, 2012, the disclosure of which is incorporated by reference herein.

BACKGROUND OF THE INVENTION

1. Field of the Invention

The present invention relates to a method of producing a planographic printing plate. In particular, the present invention relates to a method of producing a planographic printing plate, in which a positive-working planographic printing plate precursor for an infrared laser for direct plate making, which allows direct plate making from a digital signal from computers and the like, is used.

2. Description of the Related Art

Recently, significant progress has been made in the development of lasers, and in particular, solid lasers and semiconductor lasers having high output and small size, and also a light emission range in the near-infrared to infrared region, are widely available. At present, various light sensitive compositions are used as a visible image forming material or a material for recording a planographic printing plate precursor, and the aforementioned lasers are very useful as a light source for light exposure of a light sensitive composition to directly form an image from digital data such as computer data.

A positive-working planographic printing plate precursor for an infrared laser has an alkali soluble binder resin, an infrared absorbing agent that absorbs light and generates heat (that is, an IR dye), and the like, as essential components. In an unexposed region (that is, an image area), such an infrared absorbing agent or the like functions as a dissolution inhibiting agent which substantially decreases the solubility of a binder resin, owing to the interaction between the IR dye and the binder resin. Meanwhile, in an exposed region (that is, a non-image area), the interaction between the IR dye and the binder resin is suppressed by the heat generated in the exposed region, whereby the exposed region dissolves in an alkaline developer and a planographic printing plate is formed.

However, in a positive-working planographic printing plate precursor for an infrared laser, a difference (that is, solubility discrimination: hereinafter, referred to as "solubility discrimination" as appropriate) between the dissolution resistance of a region unexposed (that is, an image area) to a developer and the dissolution property of an exposed region (that is, a non-image area) is not sufficient under various use conditions, and problems like over-development and imperfect development may easily occur as a result of a change in use conditions. Further, even in a case in which the surface state is slightly changed by contact with the surface during handling or the like, there has been a problem that the unexposed region (that is, the image area) is dissolved during development to form a scratch shape, yielding insufficient receptivity or reduced scratch resistance caused by a defect in the image area.

A compound represented by an infrared absorbing agent that functions as a dissolution inhibiting agent in the recording layer of a positive-working planographic printing plate precursor for an infrared laser works only as a dissolution inhibiting agent for an unexposed region (image area), and does not promote the dissolution of an exposed region (non-image area). Therefore, in order to provide a difference in dissolution property between an unexposed region and an exposed region in a positive-working planographic printing plate precursor for an infrared laser, it is necessary to use in advance, as a binder resin, one with high solubility in an alkali developer. As a result, the state before development becomes unstable. Further, in a planographic printing plate precursor, an ink-receiving recording layer is formed on a hydrophilic support. As a result, there is a problem that the adhesion property of the recording layer is unstable at an interface with a support and the scratch resistance of an unexposed region (image area) is also affected thereby. Therefore, from the viewpoint of image reproducibility and also recent demands for high resolution images, sufficient dissolution discrimination is now demanded so that the durability of an image area can be improved in a formed planographic printing plate.

To solve the problems described above, various suggestions have been made. For example, for the purpose of improving wear resistance or development resistance, a method of having an alkali soluble polymer compound having a partial siloxane structure or an alkali soluble polymer compound having a fluoroalkyl group and localizing the resin near the surface of an image recording layer has been suggested (for example, see Japanese Patent Application Laid-Open (JP-A) Nos. 2005-181963 and 2006-53487).

SUMMARY OF THE INVENTION

According to the aforementioned technique of localizing a resin having a hydrophobic partial structure at a surface, development resistance in an unexposed region and ink receptivity in a formed image region are improved. However, with respect to the dissolution discrimination, there is still room for improvement.

An object of the present invention, which is devised in view of the problems of the conventional techniques described above, is to provide a method for producing a planographic printing plate which is capable of attaining a satisfactory difference (solubility discrimination) between the dissolution resistance of a region unexposed (image area) to a developer and the dissolution property of an exposed region (non-image area) and forming an image region with excellent scratch resistance.

As a result of intensive research by the inventors of the present invention, it was found that, by developing a planographic printing plate precursor which contains a specific resin in a recording layer present at the outermost surface in a positive-working recording layer having a multilayer structure, with a developer containing a specific compound, the aforementioned problems are solved. The invention is completed accordingly.

A method for producing a planographic printing plate according to one aspect of the invention is a method for producing a planographic printing plate, the method including in the following order:

subjecting a planographic printing plate precursor to image-wise light exposure (i.e., exposure process), the planographic printing plate precursor including: a surface-hydrophilic support; and, on the surface-hydrophilic support, at least two recording layers including an alkali-soluble polymer compound, wherein at least one layer of the at least two recording layers is a positive-working recording layer including (A) an infrared absorbing agent and an outermost recording layer of the at least two recording layers includes (B) a water-insoluble and alkali-soluble polymer compound that includes a repeating unit having a partial structure selected from the group consisting of a fluoroalkyl group and a siloxane structure and includes a repeating unit having an alkali-soluble group; and developing the planographic printing plate precursor after the image-wise light exposure using an alkali developer containing (C) at least one ammonium salt compound selected from the group consisting of the compounds represented by the following Formulae (C-1) to (C-3) (development step).

(C-1)

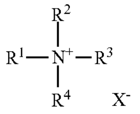

(C-2)

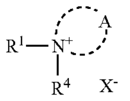

(C-3)

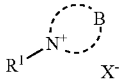

In Formula (C-1), $R^1$ represents a methyl group or an ethyl group; $R^2$ and $R^3$ each independently represent a hydrocarbon group having from 3 to 20 carbon atoms; $R^4$ represents a hydrocarbon group; and $X^-$represents a counter anion.

In Formula (C-2), $R^1$ represents a methyl group or an ethyl group; A represents an atomic group that forms a nitrogen-containing aliphatic ring together with $N^+$in Formula (C-2); $R^4$ represents a hydrocarbon group; and $X^-$represents a counter anion.

In Formula (C-3), $R^1$ represents a methyl group or an ethyl group; B represents an atomic group that forms a nitrogen-containing aromatic ring with $N^+$in Formula (C-2); and $X^-$represents a counter anion.

In an exemplary embodiment of the invention, the repeating unit having a partial structure selected from the group consisting of a fluoroalkyl group and a siloxane structure is preferably a repeating unit derived from a monomer represented by the following Formula (1) or a repeating unit having a partial structure represented by the following Formula (2).

(1)

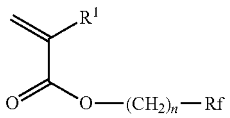

In Formula (1), Rf represents a substituent group including a fluoroalkyl group having 9 or more fluorine atoms or a perfluoroalkyl group having 9 or more fluorine atoms; n represents 1 or 2; and $R^1$ represents a hydrogen atom or a methyl group.

(2)

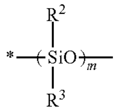

In Formula (2), $R^2$ and $R^3$ each independently represent an alkyl group or an aryl group; and m represents an integer of from 1 to 500.

The alkali-soluble group contained in (B) the alkali-soluble polymer compound is preferably a carboxyl group.

Further, examples of preferred embodiments of the ammonium salt compound contained in an alkali-developer which is used for the development step include: an embodiment in which a nitrogen-containing aliphatic ring which is formed by A with $N^+$in Formula (C-2) is a 5-membered or 6-membered saturated hydrocarbon ring which may optionally have an additional heteroatom; and an embodiment in which a nitrogen-containing aromatic ring which is formed by B with $N^+$in Formula (C-3) is a 6-membered saturated aromatic ring.

The alkali developer preferably contains at least one ammonium salt compound selected from the group consisting of the compounds represented by Formulae (C-1) to (C-3) in an amount of from 1 mg to 10 g per one liter of the alkali developer.

In the present specification, the term "recording layer present at the outermost surface" indicates a recording layer which is farthest from the support having a hydrophilic surface and closest to the exposure surface. In the present specification, it is suitably referred to as an "upper layer" or an "upper recording layer".

The planographic printing plate precursor of the invention may have, in addition to the plural recording layers, other layers as desired such as a surface protective layer or an undercoat layer on the hydrophilic surface of the hydrophilic support, as long as the effect of the invention is not impaired. Furthermore, on a surface of the support on which no positive-working recording layer is formed, a backcoat layer or the like may be formed as desired.

According to the invention, a difference between the dissolution resistance of a region unexposed to a developer and the dissolution property of an exposed region is obtained at a satisfactory level, and thus a method for producing a planographic printing plate which enables formation of a planographic printing plate having a formed image region having excellent scratch resistance is provided.

DETAILED DESCRIPTION OF THE INVENTION

Hereinbelow, the method for producing a planographic printing plate of the invention will be described in detail.

While the invention is particularly shown and described with reference to exemplary embodiments thereof, it is noted that the invention is not limited to the embodiments, and can be modified in various ways without departing from the spirit and scope of the present invention.

In the present specification, numerical ranges described using the term "to" means a range including the numbers described before and after the "to" as the lower limit and the upper limit thereof, respectively. Furthermore, when plural materials are present for each component in the composition, the amount of each component in the composition described in the present specification means the total amount of the plural materials present in the composition, unless specifically described otherwise.

With regard to recitation of a group (or an atomic group), a recitation that is not defined in terms of substitution or non-substitution includes not only those groups having a substituted group but also those having no substituent group. For example, an "alkyl group" is used to mean both an alkyl group having no substituent group (that is, an unsubstituted alkyl group) and an alkyl having a substituent group (that is, a substituted alkyl group).

Further, the expression “step” means an independent step. However, the expression “step” is used herein even when the step cannot be clearly distinguished from other steps but the desired effect of the step is accomplished.

In the present specification, a recitation “(meth)acrylic acid” may be used for indicating either acrylic acid or methacrylic acid or both, and a recitation “(meth)acrylate” may be used for indicating either acrylate or methacrylate or both.

Furthermore, unless specifically described otherwise, content is indicated in terms of weight. Furthermore, “% by mass” indicates a ratio with respect to the total amount of the composition, and “solid matter” indicates components other than a solvent in a composition, unless specifically described otherwise.

According to an aspect of the invention, the method for producing a planographic printing plate includes in the following order: subjecting a planographic printing plate precursor to image-wise light exposure (exposure step), wherein the planographic printing plate precursor has, on a support having a hydrophilic surface, at least two recording layers containing an alkali-soluble polymer compound, at least one layer of which is a positive-working recording layer containing (A) an infrared absorbing agent, and the recording layer present on the outermost surface among the at least two recording layers contains (B) a water-insoluble and alkali-soluble polymer compound including a repeating unit having a partial structure (hereinafter, suitably referred to as a “surface orientating partial structure”) selected from the group consisting of a fluoroalkyl group and a siloxane structure and a repeating unit having an alkali-soluble group; and developing the planographic printing plate precursor after the image-wise exposure using an alkali developer containing at least one ammonium salt compound selected from the group consisting of the compounds represented by the following Formulae (C-1) to (C-3) (development step). In other words, the recording layer including a specific alkali-soluble polymer compound is developed using an alkali developer containing a specific ammonium compound.

Although the working mechanism of the invention remains unclear, the inventors assume as follows. Since the upper recording layer of a planographic printing plate precursor used for the method of the invention includes an alkali-soluble polymer compound including a repeating unit having a specific hydrophobic partial structure with surface orientating property and a repeating unit having an alkali-soluble group, (B) the specific alkali-soluble polymer compound is oriented at a surface of the recording layer owing to the function of the surface-orientating group. While the alkali-soluble group of (B) the specific alkali-soluble polymer compound contributes to improvement of development property in an exposed region, the cation center of (C) the specific ammonium salt compound contained in the developer and an anion center formed by dissociation of the alkali-soluble group in an unexposed region interact at a short-chain alkyl group side having little steric hindrance in the specific ammonium salt compound. As such, the presence of a portion having a hydrocarbon group which has the specific ammonium salt with large size can effectively suppress, in conjunction with the presence of a surface orientating partial structure with high hydrophobicity contained in the specific alkali-soluble polymer compound, the permeability of the developer in the outermost surface of a recording layer. Meanwhile, in an exposed region, the alkali-soluble polymer compound can exhibit its own solubility in alkali as a result of release of an interaction with a dissolution inhibiting agent. However, the alkali-soluble polymer compound having increased solubility in a developer is not much affected by the ammonium salt compound, and thus the dissolution property of an unexposed region is not inhibited. For such reasons, it is believed that not only the dissolution discrimination is improved but also the scratch resistance of a formed image is enhanced.

Hereinafter, the planographic printing plate precursor which is used for the method for producing a planographic printing plate of the invention will be described.

Planographic Printing Plate Precursor

The planographic printing plate precursor used in the invention includes a surface-hydrophilic support, and, on the support, two or more recording layers containing an alkali-soluble polymer compound, in which at least one of the recording layers is a positive-working recording layer which contains an infrared absorbing agent, and, among the two or more recording layers, the recording layer which is present at the outermost surface of the recording layers includes (B) a water-insoluble and alkali-soluble polymer compound containing a repeating unit having a partial structure selected from the group consisting of a fluoroalkyl group and a siloxane structure and a repeating unit having an alkali-soluble group.

Upper Recording Layer

The planographic printing plate precursor in the invention has two or more recording layers, and the upper recording layer which is present at the outermost surface of the recording layers (that is, the furthest layer from the support) includes (B) the water-insoluble and alkali-soluble polymer compound (hereinafter, suitably referred to as a “specific polymer compound”) that includes a repeating unit having a partial structure selected from the group consisting of a fluoroalkyl group and a siloxane structure and a repeating unit having an alkali-soluble group. Furthermore, it preferable that the upper recording layer further includes (A) an infrared absorbing agent.

As used herein, the expression “water-insoluble” described in the “water-insoluble and alkali-soluble polymer compound” including the specific polymer compound (B) in the invention means that, even when a coating film formed by dissolving the polymer compound in a suitable solvent followed by coating on a supported and drying is immersed for 30 sec. in an aqueous solution with liquid temperature of 25° C. to 35° C. and pH of 6 to 8 and then washed with running water, no reduction in film thickness is observed for the formed coating film. The expression “alkali-soluble” means that, when the coating film formed in the same manner is immersed for 60 sec. in an aqueous alkali solution with liquid temperature of 25° C. to 35° C. and pH of 8.5 to 10.8 and then washed with running water, the coating film is dissolved and lost, yielding a state in which the support is exposed.

(B) Water-Insoluble and Alkali-Soluble Polymer Compound Including Repeating Unit Having Partial Structure Selected from the Group Consisting of Fluoroalkyl Group and Siloxane Structure and a Repeating Unit Having Alkali-Soluble Group The (B) specific polymer compound in the invention has at least one of: (b-1) a repeating unit including a fluoroalkyl group as a partial structure; or (b-2) a repeating unit including a siloxane structure as a partial structure.

(b-1) Repeating Unit Including Fluoroalkyl Group as Partial Structure

The repeating unit included as a copolymerization component (b-1) in (B) the specific polymer compound in the invention is not specifically limited, as long as it has a substituent group in which at least part of the hydrogen atoms of an alkyl group is substituted with a fluorine atom, such as a fluoroalkyl group or a perfluoroalkyl group. In particular, it is preferably a repeating unit derived from a fluorine-containing monomer that is represented by the following Formula (1).

(1)

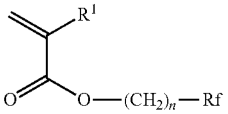

In Formula (1), Rf represents a substituent group including a fluoroalkyl group having 9 or more fluorine atoms or a perfluoroalkyl group having 9 or more fluorine atoms, n represents 1 or 2, and $R^1$ represents a hydrogen atom or a methyl group.

Specific examples of the repeating unit containing a fluorine atom-containing substituent group represented by Rf, which is a preferred embodiment of the repeating unit including a fluoroalkyl group as a partial structure, include the repeating units derived from fluoroalkyl (meth)acrylate as described below.

$$CH_2{=}CRCO_2(CH_2)_mC_nF_{2n+1}$$

(wherein m represents 1 or 2, n represents an integer of from 4 to 12, and R represents an alkyl group having 1 or 2 carbon atoms)

$$CH_2{=}CRCO_2(CH_2)_m(CF_2)_nH$$

(wherein m represents 1 or 2, n represents an integer of from 4 to 12, and R represents an alkyl group having 1 or 2 carbon atoms)

By using a fluoroalkyl or perfluoroalkyl group having 9 or more fluorine atoms as the fluoroalkyl group or perfluoroalkyl group represented by Rf, a recoding layer having fluorine atom concentration distribution in the film thickness direction is formed, and as a result of such concentration distribution, a phenomenon showing that fluorine concentration is high near the surface of the recording layer while it decreases in direction to the center occurs. Among them, a group having 9 to 30 fluorine atoms per monomer unit is preferable, and a group having 13 to 25 fluorine atoms per monomer unit is more preferable. When the number of fluorine atoms is within the above ranges, an effect of orientating the specific polymer compound at the surface is well exhibited. Furthermore, a secondary effect such as improved development resistance of an image region during development and excellent ink receptivity of an image region, which is formed by the presence of a fluoroalkyl group, is also obtained.

When the number of fluorine atoms in one unit is within the above ranges, surface orienting property and development resistance caused by the presence of fluorine atoms are improved, and it is less likely that a decrease in developability of an unexposed region occurs.

In addition, from the viewpoint of a balance between the improvement of surface orienting property and development resistance of the specific polymer compound and the inhibition of developability decrease, the content of fluorine atoms contained in the specific polymer compound is preferably in the range of from 5 mmol/g to 30 mmol/g, and more preferably in the range of from 8 mmol/g to 25 mmol/g. When the number of fluorine atoms contained in the copolymer is excessively large, there may be a case in which decrease in receptivity that is caused by oil-repellency of fluorine atoms occurs.

Hereinafter, examples of the repeating unit including (b-1) the fluoroalkyl group as a partial structure, which may be included in the specific polymer compound, are shown. However, the invention is not limited to them.

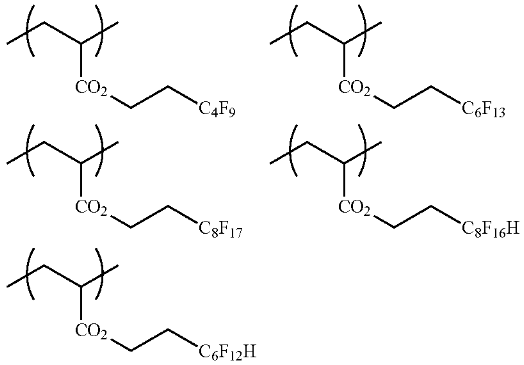

In (B) the specific polymer compound according to the invention, the content of the repeating unit including (b-1) the fluoroalkyl group as a partial structure is preferably in a composition ratio range of from 10 mol % to 90 mol %, and more preferably in a composition ratio range of from 30 mol % to 70 mol %, with respect to the total repeating units in (B) the specific polymer compound.

(b-2) Repeating Unit Including a Siloxane Structure as a Partial Structure

The repeating unit including a siloxane structure as a partial structure, which may be contained in (B) the specific polymer compound according to the invention, is not specifically limited, as long as it is a repeating unit which includes a partial structure having at least one siloxane structure as described below.

Formula (2)

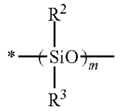

In Formula (2), $R^2$ and $R^3$ each independently represent an alkyl group or an aryl group, and m represents an integer of from 1 to 500.

The siloxane structure may be a linear polysiloxane structure in which m in Formula (2) is 2 or larger, a cyclic polysiloxane structure containing the repeating unit, or a polysiloxane structure having a branched chain. Furthermore, the siloxane structure may be a partial structure including two or more of the siloxane structures, which is formed by linking of the siloxane structures in which m in Formula (2) is 1 via a trivalent or higher-valent linking group.

The repeating unit including the siloxane structure as a partial structure contains preferably at least one, more preferably 3 or more, and still more preferably 5 or more, of the siloxane structure represented by Formula (2). Furthermore, the number of the siloxane structure represented by Formula (2) is preferably less than 500, more preferably less than 400, and still more preferably less than 300.

It is preferable that $R^2$ and $R^3$ each independently represent a methyl group, an ethyl group, or a phenyl group.

The alkyl group or aryl group represented by $R^2$ or $R^3$ in Formula (2) may additionally have a substituent group, and examples of preferred additional substituent group include a polyalkylene oxide group. The polyalkylene oxide group contains plural alkylene oxide repeating units each represented by [—$C_nH_{2n}$—O—], in which n is preferably an integer of from 2 to 5. Examples of preferred alkylene oxide repeating unit include ethylene oxide, propylene oxide, and a mixture thereof. The —$C_nH_{2n}$—moiety in an alkylene oxide group may include a linear or branched chain, and it may additionally have a substituent group. The number of alkylene oxide repeating units is preferably from 2 to 10, and more preferably from 2 to 5.

Hereinbelow, examples of the repeating unit including (b-2) the siloxane structure as a partial structure, which may be contained in the specific polymer compound, are shown. However, the invention is not limited to them.

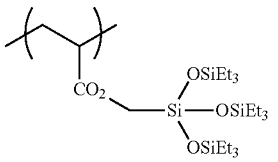

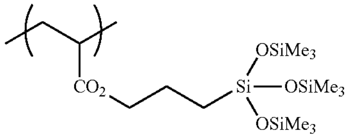

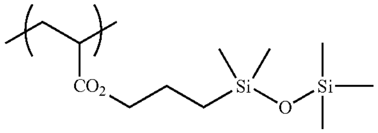

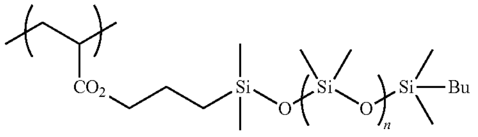

n = 8

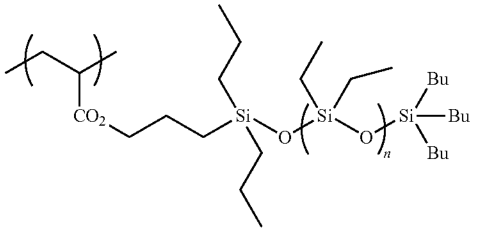

n = 8

In (B) the specific polymer compound according to the invention, only one type of the repeating unit including (b-2) the siloxane structure as a partial structure may be contained, or two or more thereof may be contained. The content thereof is preferably in the composition ratio range of from 10 mol % to 90 mol %, and more preferably in the composition ratio range of from 30 mol % to 70 mol %, with respect to the total repeating units in (B) the specific polymer compound.

(b-3) Repeating Unit Including an Alkali Soluble Group

Since (B) the specific polymer compound according to the invention has a repeating unit including (b-3) an alkali-soluble group, favorable alkali solubility is attained in an exposed region.

The repeating unit including (b-3) the alkali-soluble group according to the invention is a repeating unit derived from a monomer having an alkali-soluble group, and the monomer is not specifically limited as long as it is a compound which has, in the molecule thereof, at least one alkali-soluble group and at least one polymerizable unsaturated group, respectively.

In particular, it is preferable that the (B) specific polymer compound includes a repeating unit derived from a monomer which has the alkali-soluble group belonging to the following (1) to (6) or a salt thereof.

(1) Phenol group (—Ar—OH)

(2) Sulfonamide group (—$SO_2NH$—R)

(3) Substituted sulfonamide acid group (hereinafter, referred to as an "active imide group")

[—$SO_2NHCOR$, —$SO_2NHSO_2R$, —$CONHSO_2R$]

(4) Carboxyl group (—$CO_2H$)

(5) Sulfonic acid group (—$SO_3H$)

(6) Phosphoric acid group (—$OPO_3H_2$)

In the above groups (1) to (6), Ar represents a divalent aryl linking group which may have a substituent group, and R represents a hydrogen atom or a hydrocarbon group which may have a substituent group.

Among the compounds having an acid group which is selected from the above groups (1) to (6), a compound having (1) a phenol group, (2) a sulfonamide group, or (4) a carboxyl group is preferable from the viewpoint of effects. In particular, a group selected from (4) a carboxyl group or a salt thereof is most preferable from the viewpoint that developability of an unexposed region is obtained at satisfactory level.

Examples of the most preferred repeating unit including an alkali-soluble group that is used for the invention include a repeating unit represented by the following Formula (I).

Formula (I)

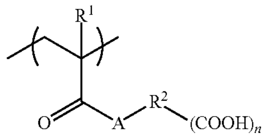

In Formula (I), $R^1$ represents a hydrogen atom or a methyl group, and particularly preferably represents a methyl group. The linking group represented by $R^2$ in Formula (I) represents a linking group having 2 to 30 atoms excluding the substituent group. Specific examples of the linking group represented by $R^2$ include a divalent group such as an alkylene group, a substituted alkylene group, an arylene group, or a substituted arylene group, and a group having a structure in which two or more of these groups are linked to each other via an amide bond or an ester bond. Preferred examples of a linking group having a cyclic structure include a structure in which alkylene groups such as an ethylene group or a propylene group are linked to each other via an ester group.

Preferred examples of the linking group represented by $R^2$ include a (n+1)-valent hydrocarbon group which has an aliphatic cyclic structure having 3 to 30 carbon atoms. Specific examples thereof include a compound having an aliphatic cyclic structure such as cyclopropane, cyclopentane, cyclohexane, cycloheptane, cyclooctane, cyclodecane, dicyclohexyl, tercyclohexyl, or norbornane. Further, a (n+1)-valent hydrocarbon group which is obtained by removing (n+1) hydrogen atoms on any carbon atoms of an aliphatic cyclic compound having 5 to 20 atoms may be also used.

Any carbon atoms of the aliphatic cyclic or chain compound may be substituted with at least one heteroatom selected from the group consisting of a nitrogen atom, an oxygen atom, and a sulfur atom.

Examples of the substituent group which may be introduced to the linking group represented by $R^2$ include a monovalent non-metallic element group except hydrogen, for example, a halogen atom (—F, —Br, —Cl, —I), a hydroxyl group, an alkoxy group, an aryloxy group, a mercapto group, an aryl group, an alkenyl group, and an alkynyl group.

In Formula (I), A represents —N($R^3$)— or an oxygen atom. In a case in which A in Formula (I) represents —N($R^3$)—, $R^3$ represents a hydrogen atom or a monovalent hydrocarbon group having 1 to 10 carbon atoms. Examples of the monovalent hydrocarbon group having 1 to 10 carbon atoms represented by $R^3$ include an alkyl group, an aryl group, an alkenyl group, and an alkynyl group.

Specific examples of the alkyl group include a linear, branched, or cyclic alkyl group having 1 to 10 carbon atoms, such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, or a 2-norbornyl group.

A in Formula (I) is preferably an oxygen atom or —NH— due to easiness in synthesis.

Furthermore, n in Formula (I) represents an integer of from 1 to 5, and from the viewpoint of receptivity, it is preferably 1.

When the number of acid groups, such as a carboxyl group, in the specific copolymer is too small, developability is deteriorated. On the other hand, when it is too large, receptivity cannot be obtained at a desired level. Thus, from the viewpoints of the receptivity and sensitivity, the acid number per one molecule of the specific copolymer is preferably 0.2 to 10.0 mmol/g, more preferably 0.3 to 5.0 mmol/g, and still more preferably 0.4 to 3.0 mmol/g.

The specific polymer compound according to the invention may include, in addition to at least one repeating unit selected from the group consisting of the (b-1) and (b-2) repeating units and (b-3) the repeating unit including an alkali-soluble group, other repeating units as a copolymerization component under for the purposes of improving coating property or the like, as long as the effects of the invention are not impaired.

Examples of other repeating units which may be used in combination include a repeating unit derived from a known monomer such as acrylic acid esters, methacrylic acid esters, acrylamides, methacrylamides, vinyl ester, styrenes, acrylonitrile, maleic acid anhydride, or maleic acid imide.

As for the constitution of (B) the specific polymer compound according to the invention, an embodiment in which at least one repeating unit selected from the group consisting of the (b-1) and (b-2) repeating units is contained at a composition ratio (total ratio) of 10 mol % to 90 mol % and (b-3) the repeating unit is contained at a composition ratio of 90 mol % to 10 mol % is preferable. It is more preferable that at least one repeating unit selected from the group consisting of the (b-1) and (b-2) repeating units is contained at a composition ratio (total ratio) of 30 mol % to 70 mol %, and (b-3) the repeating unit is contained at a composition ratio of 70 mol % to 30 mol %.

Specific examples of (B) the specific polymer compound used in the invention are described hereinbelow in terms of the repeating units contained in the alkali-soluble polymer compound and its content ratios (molar ratios) and weight average molecular weights (Mw). However, the invention is not limited to them.

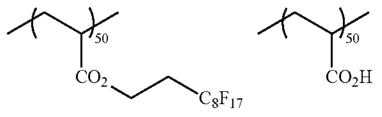

Mw: 38,000

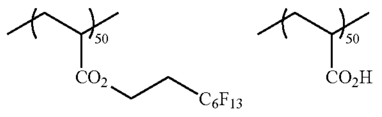

Mw: 42,000

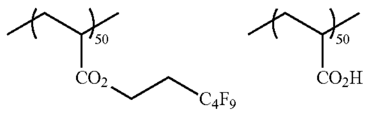

Mw: 56,000

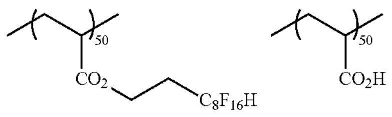

Mw: 32,000

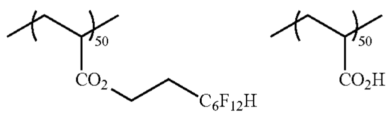

Mw: 70,000

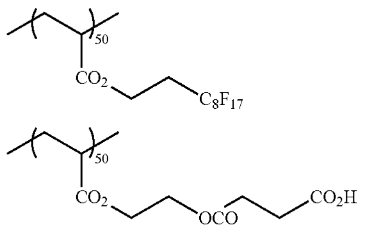

Mw: 42,000

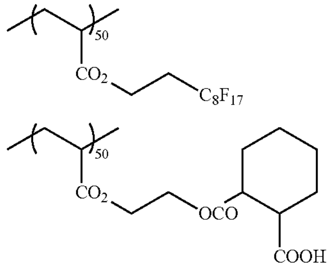

Mw: 80,000

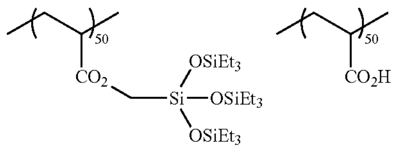

Mw: 52,000

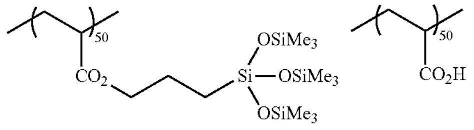

Mw: 54,000

-continued

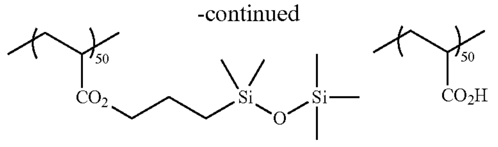

Mw: 38,000

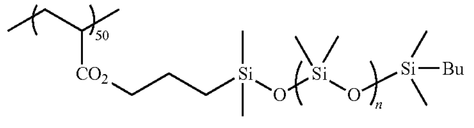

n = 8

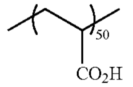

Mw: 66,000

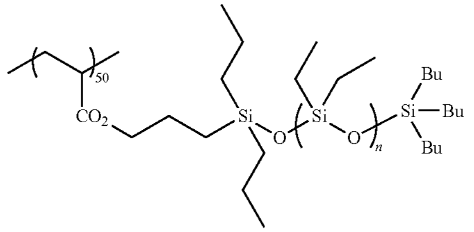

n = 8

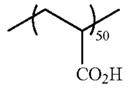

Mw: 46,000

The weight average molecular weight (Mw) of (B) the specific polymer compound used in the invention is preferably in the range of from 1,000 to 1,000,000, more preferably in the range of from 2,000 to 500,000, and still more preferably in the range of from 3,000 to 300,000.

In the present specification, the molecular weight (Mw) may be measured by gel permeation chromatography (GPC) using N-methylpyrrolidone as a development solvent. In such a case, polystyrene is used as a standard for molecular weight.

The upper recording layer may include only one of (B) the specific polymer compound according to the invention, or may include a combination of two or more thereof. The content of (B) the specific polymer compound is preferably from 0.001% by mass to 25% by mass, and more preferably from 0.01% by mass to 20% by mass, with respect to the total solid matter in the upper recoding layer.

(A) Infrared Absorbing Agent

At least one layer of the multilayered recording layer according to the invention is required to contain an infrared absorbing agent. From the viewpoint of improving solubility discrimination, the infrared absorbing agent is preferably contained in the upper recording layer.

As an infrared absorbing agent used in the invention, an infrared absorbing dye or pigment which has an absorption maximum at wavelength of from 700 nm to 1200 nm is used. Since the infrared absorbing agent is capable of absorbing a light energy radiation of an infrared laser or the like which is used for recoding and generating heat, it is useful in terms of enhancing recording sensitivity. The infrared absorbing agent may have a function of a dissolution inhibiting agent which is capable of interacting with a co-present alkali-soluble polymer compound.

As for the dye, commercially available dyes and known dyes described in literatures (for example, "Dye Handbook" edited by The Society of Synthetic Organic Chemistry, published in 1970) may be used. Specific examples of the dye include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarylium colorants, pyrylium salts, metal thiolate complexes, oxonol dyes, diimonium dyes, aminium dyes, and croconium dyes.

Examples of preferred dye include cyanine dyes described in Japanese Patent Application Laid-Open (JP-A) Nos. 58-125246, 59-84356, 59-202829, 60-78787, or the like, methine dyes described in Japanese Patent Application Laid-Open (JP-A) Nos. 58-173696, 58-181690, 58-194595, or the like, naphthoquinone dyes described in Japanese Patent Application Laid-Open (JP-A) Nos. 58-112793, 58-224793, 59-48187, 59-73996, 60-52940, 60-63744, or the like, squarylium dyes described in Japanese Patent Application Laid-Open (JP-A) No. 58-112792 or the like, and cyanine dyes described in U.K. Patent No. 434,875 or the like.

A near-infrared absorption sensitizing agent described in U.S. Pat. No. 5,156,938 is also suitably used, and a substituted arylbenzo(thio)pyrylium salt described in U.S. Pat. No. 3,881,924, a trimethine thiapyrylium salt described in Japanese Patent Application Laid-Open (JP-A) No. 57-142645 (or U.S. Pat. No. 4,327,169), a pyrylium compound described in Japanese Patent Application Laid-Open (JP-A) No. 58-1881051, 58-220143, 59-41363, 59-84248, 59-84249, 59-146063 or 59-146061, a cyanine pigment described in Japanese Patent Application Laid-Open (JP-A) No. 59-216146, a pentamethine thiopyrylium salt described in U.S. Pat. No. 4,283,475, and a pyrylium compound disclosed in Japanese Patent Application Laid-Open (JP-A) No. 05-13514 or 05-19702, and the like are also preferably used.

Other examples of preferred dye include near-infrared absorbing dyes represented by the formulas (I) and (II) disclosed in U.S. Pat. No. 4,756,993.

Among these dyes, examples of particularly preferred dyes include cyanine dyes, phthalocyanine dyes, oxonol dyes, squarylium dyes, pyrylium salts, thiopyrylium dyes and nickel thiolate complexes. Of these, it is most preferable to use a cyanine dye represented by the following Formula (a), because it has excellent activity of forming an interaction with an alkali-soluble polymer compound, excellent sensitivity, and excellent economic efficiency.

Formula (a)

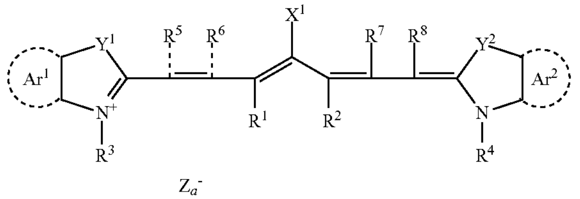

In Formula (a), $X^1$ represents a hydrogen atom, a halogen atom, —$NPh_2$, $X^2$-$L^1$ or a group described below, in which $X^2$ represents an oxygen atom or a sulfur atom, and $L^1$ represents a hydrocarbon group having 1 to 12 carbon atoms, an aromatic ring having a hetero atom, or a hydrocarbon which has 1 to 12 carbon atoms and contains a hetero atom. Here, examples of the heteroatom include N, S, O, a halogen atom, and Se.

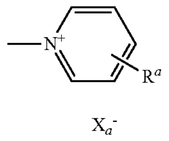

In the above structural formula, $Xa^-$ has the same definition as $Za^-$ described below, and $R^a$ represents a substituent selected from the group consisting of a hydrogen atom, an alkyl group, an aryl group, a substituted or unsubstituted amino group and a halogen atom.

In Formula (a), $R^1$ and $R^2$ each independently represent a hydrocarbon group having 1 to 12 carbon atoms. From the viewpoint of the preservation stability of a coating liquid for a recording layer (i.e., a recording layer coating liquid), $R^1$ and $R^2$ preferably each represent a hydrocarbon group having two or more carbon atoms, and it is particularly preferable that $R^1$ and $R^2$ be bonded to each other to form a 5-membered or 6-membered ring.

In Formula (a), $Ar^1$ and $Ar^2$ may be the same as or different from each other, and independently represent an aromatic hydrocarbon group optionally having a substituent group. Preferred examples of the aromatic hydrocarbon group include a benzene ring and naphthalene ring. Preferred examples of the substituent group include a hydrocarbon group having 12 or less carbon atoms, a halogen atom, and an alkoxy group having 12 or less carbon atoms. $Y^1$ and $Y^2$ may be the same as or different from each other, and each independently represent a sulfur atom or a dialkylmethylene group having 12 or less carbon atoms. $R^3$ and $R^4$ may be the same as or different from each other, and each independently represent a substituted or unsubstituted hydrocarbon group having 20 or less carbon atoms, and preferred examples of the substituent group include an alkoxy group having 12 or less carbon atoms, a carboxyl group and a sulfo group. $R^5$, $R^6$, $R^7$ and $R^8$, which may be the same as or different from each other, each independently represent a hydrogen atom or a hydrocarbon group having 12 or less carbon atoms. From the viewpoint of the availability of raw materials, $R^5$, $R^6$, $R^7$ and $R^8$ is each preferably a hydrogen atom. In Formula (a), $Za^-$ represents a counter anion. It should be noted that, when a cyanine dye represented by Formula (a) has an anionic substituent group in the structure thereof and it is not necessary to neutralize the electric charge thereof, $Za^-$ is not needed. From the viewpoint of preservation stability of a coating liquid for a recording layer, examples of $Za^-$ preferably include a halogen ion, a perchlorate ion, a tetrafluoroborate ion, a hexafluorophosphate ion, and a sulfonate ion, and a perchlorate ion, a hexafluorophosphate ion and an aryl sulfonic acid ion are particularly preferable.

Specific examples of the cyanine dye represented by Formula (a) which may be suitably used in the invention include the cyanine dye A shown below as the most preferred embodiment, as well as those described in paragraphs [0017]to [0019]of Japanese Patent Application Laid-Open (JP-A) No. 2001-133969, in paragraphs [0012]to [0038]of Japanese Patent Application Laid-Open (JP-A) No. 2002-40638, and in paragraphs [0012]to [0023]of Japanese Patent Application Laid-Open (JP-A) No. 2002-23360.

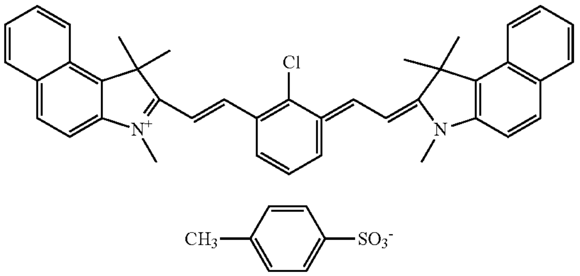

Cyanine dye A

The amount of infrared absorbing agent to be added to the upper recording layer is preferably from 0.01% by mass to 50% by mass, more preferably from 0.1% by mass to 30% by mass, and particularly preferably from 1.0% by mass to 30% by mass, with respect to the total solid content of the upper recording layer. When the amount to be added is within the above ranges, favorable sensitivity and uniformity of the upper recording layer are attained.

The infrared absorbing agent may be also included in a lower recording layer described below. The amount of infrared absorbing agent to be added to a lower recording layer is preferably from 0.01% by mass to 50% by mass, more preferably from 0.1% by mass to 30% by mass, and particularly preferably from 1.0% by mass to 30% by mass, with respect to the total solid content of the lower recording layer.

The infrared absorbing agent may be used either singly, or in combination of two or more thereof.

In the invention, as long as the effect of the present invention is not impaired, the upper recoding layer according to the invention may further include various known additives as desired, other than (B) the specific polymer compound and preferred components used in combination that are described above. Since the same additives are also used for the lower recording layer, they will be described in detail in the section of the lower recording layer.

Lower Recording Layer

The planographic printing plate precursor according to the invention has at least two recording layers, and the layer(s) other than the upper recording layer present at the outermost surface is/are referred to as "lower recording layer(s)". In general, the planographic printing plate precursor has a multilayer structure including an upper recording layer and a lower recording layer that is a recording layer which is closest to the support. The lower recording layer is not particularly limited as long as it includes a water-insoluble and alkali-soluble polymer compound (hereinafter, simply referred to as an "alkali-soluble resin" or "alkali-soluble polymer"), and, for example, it may include (A) the infrared absorbing agent.

Alkali-Soluble Polymer

The alkali-soluble resin or polymer which is used for a recoding layer other than the upper layer (hereinafter, suitably referred to as a "lower recording layer") in the invention, and which may be optionally included in the upper recording layer is not specifically limited, as long as it is a resin or polymer conventionally known in the technical field. Preferably, it is a polymer compound having in the molecule thereof any one functional group selected from the group consisting of (1) a phenolic hydroxyl group, (2) a sulfonamide group, and (3) an active imide group. Examples thereof include the following, but it is not limited to them. The alkali-soluble resin included in the lower recording layer is preferably a polymer compound having a structure different from (B) the specific polymer compound.

Examples of alkali-soluble resins including a (1) phenolic hydroxyl group include Novolac resins such as a phenol formaldehyde resin, an m-cresol formaldehyde resin, a p-cresol formaldehyde resin, a m-/p-mixed cresol formaldehyde resin or a phenol/cresol (m-, p-, or m-/p-mixed may be employed) mixed formaldehyde resin, and pyrogallol acetone resins. In addition to the above, as the polymer compound having a phenolic hydroxyl group, a polymer group having a phenolic hydroxyl group in a side chain is preferable. Examples of the polymer compound having a phenolic hydroxyl group in a side chain include a polymer compound obtained by homopolymerization of a polymerizable monomer consisting of a low-molecular-weight compound which has a phenolic hydroxyl group and a polymerizable unsaturated bond, at least one for each, or by copolymerization of such monomer with other polymerizable monomer.

Examples of the polymerizable monomer including a phenolic hydroxyl group include acrylamide, methacrylamide, acrylic acid ester, methacrylic acid ester, and hydroxystyrene, which have a phenolic hydroxyl group. Specific examples thereof that can be suitably used include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate. Further, a condensation polymer of a phenol having, as a substituent group, an alkyl group having 3 to 8 carbon atoms and formaldehyde, as described in U.S. Pat. No. 4,123,279, such as a t-butylphenol formaldehyde resin or an octylphenol formaldehyde resin, may be also used in combination.

Examples of the alkali-soluble resin having (2) a sulfonamide group include a polymer compound obtained by homopolymerization of a polymerizable monomer having a sulfonamide or copolymerization of such monomer with other polymerizable monomer (with the proviso that, the resin including the structural unit represented by Formula (I) or Formula (III) is excluded). Examples of the copolymerizable monomer having a sulfonamide group include a copolymerizable monomer consisting of a low-molecular-weight compound which has, in single molecule, a sulfonamide group, that is, $—NH—SO_2—$, in which at least one hydrogen atom is bonded to the nitrogen atom, and a polymerizable unsaturated bond, at least one for each. Among them, a low-molecular-weight compound which has an acryloyl group, an aryl group, or a vinyloxy group, and a substituted or mono-substituted aminosulfonyl group or a substituted sulfonylimino group is preferable.

Examples of the alkali-soluble resin having (3) an active imide group preferably include resins including the active imide group in the molecule thereof. Examples of the polymer compound include a polymer compound obtained by homopolymerization of a polymerizable monomer consisting of a low-molecular-weight compound which has an active imide group and a polymerizable unsaturated bond, at least one for each, or by copolymerization of such monomer with other polymerizable monomer.

Specific examples of the compound include N-(p-toluenesulfonyl)methacrylamide and N-(p-toluenesulfonyl)acrylamide.

As another alkali-soluble resin used in the invention, a polymer compound obtained by homopolymerization of two or more polymerizable monomers such as the polymerizable monomer having a phenolic hydroxyl group, the polymerizable monomer having a sulfonamide group, and the polymerizable monomer having an active imide group, or a polymer compound obtained by copolymerization of such two or more polymerizable monomers with other polymerizable monomers are preferable. When a polymerizable monomer having a phenolic hydroxyl group is copolymerized with a polymerizable monomer having a sulfonamide group and/or a polymerizable monomer having an active imide group, the mixing ratio (in mass) between them (i.e., polymerizable monomer having a phenolic hydroxyl group:polymerizable monomer having a sulfonamide group and/or polymerizable monomer having an active imide group) is preferably within the range of from 50:50 to 5:95, and particularly within the range of from 40:60 to 10:90.

When the alkali-soluble resin of the invention is a copolymer between the polymerizable monomer having a phenolic hydroxyl group, the polymerizable monomer having a sulfonamide group, or the polymerizable monomer having an active imide group, and other polymerizable monomer(s), it is preferable that the copolymer contains the monomer that is capable of imparting alkali solubility preferably in an amount of 10 mol % or more, and more preferably 20 mol % or more, from the viewpoints of improving alkali solubility and development latitude.

As for the monomer component which is to be copolymerized with the polymerizable monomer having a phenolic hydroxyl group, the polymerizable monomer having a sulfonamide group, or the polymerizable monomer having an active imide group, the compounds belonging to the following (m1) to (m12) can be exemplified, but not limited thereto.

(m1) Acrylic acids esters and methacrylic acid esters having an aliphatic hydroxyl group, such as 2-hydroxyethyl acrylate or 2-hydroxyethyl methacrylate.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamides or methacrylamides, such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, and N-ethyl-N-phenyl acrylamide.

(m5) Vinyl ethers such as ethylvinyl ether, 2-chloroethylvinyl ether, hydroxyethylvinyl ether, propylvinyl ether, butylvinyl ether, octylvinyl ether, and phenylvinyl ether.

(m6) Vinyl esters such as vinyl acetate, vinyl chloroacetate, vinyl butyrate, and vinyl benzoate.

(m7) Styrenes such as styrene, α-methyl styrene, methyl styrene, and chloromethyl styrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-vinyl pyrrolidone, acrylonitrile, methacrylonitrile, or the like.

(m11) Unsaturated imides such as maleimide, N-acryloyl acrylamide, N-acetyl methacrylamide, N-propionyl methacrylamide, and N-(p-chlorobenzoyl)methacrylamide.

(m12) Unsaturated carboxylic acids such as acrylic acid, methacrylic acid, maleic acid anhydride, and itaconic acid.

Examples of other alkali-soluble resins include, from the viewpoint of having excellent image forming ability for light exposure using an infrared laser or the like, a resin having a phenolic hydroxyl group is preferable. Further, examples of the alkali-soluble resin having a phenolic hydroxyl group include phenol-formaldehyde condensates substituted with an alkyl group having 3 to 8 carbon atoms, such as the t-butylphenol formaldehyde resins or octylphenol formaldehyde resins as disclosed in U.S. Pat. No. 4,123,279.

Examples of the method for copolymerization of other alkali-soluble resins include a conventionally known method such as a graft copolymerization method, a block copolymerization method, or a random copolymerization method.

As for the alkali-soluble resin used in the upper recording layer, from the viewpoints of causing strong hydrogen bond in an unexposed region and resolving easily part of hydrogen bond in an exposed region, a resin having a phenolic hydroxyl group is preferable. More preferably, it is a Novolac resin. A resin having a weight average molecular weight of from 500 to 20,000 and a number average molecular weight of from 200 to 10,000 is preferable.

Examples of alkali-soluble Novolac resins which are used as other alkali soluble resins in the invention include an alkali-soluble Novolac resin such as a phenol formaldehyde resin, a xylenol cresol formaldehyde resin (e.g., 3,5-xylenol, 2,3-xylenol, 2,4-xylenol, or 2,5-xylenol), an m-cresol formaldehyde resin, a p-cresol formaldehyde resin, a m-/p-mixed cresol formaldehyde resin, and a phenol/cresol (which may be m-phenol/cresol, p-phenol/cresol, or m-/p-mixed phenol/cresol) mixed formaldehyde resin. The alkali-soluble Novolac resin having a weight average molecular weight of from 500 to 20,000 and a number average molecular weight of from 200 to 10,000 is used. Further, phenol-formaldehyde condensates substituted with an alkyl group having 3 to 8 carbon atoms, such as the t-butylphenol formaldehyde resins or octylphenol formaldehyde resins as disclosed in U.S. Pat. No. 4,123,279 may be also used.

Among the alkali-soluble Novolac resins, it is preferable that a Novolac resin having high bonding property at ortho position, for example, a xylenol cresol formaldehyde resin, an m-cresol formaldehyde resin, and a p-cresol formaldehyde resin, is included in a large amount. Specifically, the Novolac resin is included preferably in an amount of 10% by mass or more, and more preferably 30% by mass or more, with respect to the total Novolac resins.

Further, preferred examples of the resin which can be included in the lower recording layer include a (meth)acryl resin (hereinafter, suitably referred to as a "specific acryl resin") having at least one repeating unit selected from the group consisting of the structural unit represented by the following Formula (I) and the structural unit represented by the following Formula (II).

Formula (I)

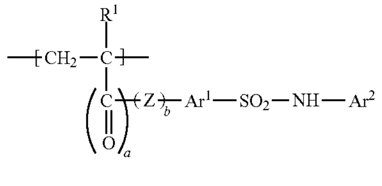

-continued

Formula (II)

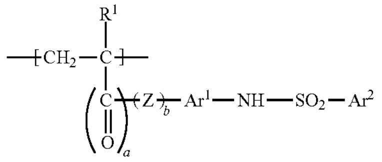

In Formula (I) and Formula (II), $R^1$ represents a hydrogen atom or an alkyl group; Z represents —O—or —N($R^2$)—, in which $R^2$ represents a hydrogen atom, an alkyl group, an alkenyl group, or an alkynyl group; $Ar^1$ and $Ar^2$ each independently represent an aromatic group, and at least one of them is a heteroaromatic group; and a and b each independently represent 0 or 1.

In Formulae (I) and (II), $R^1$, $R^2$, $Ar^1$ and $Ar^2$ may each additionally have a substituent group.

Hereinafter, the specific acryl resin will be described in greater detail.

The specific acryl resin of the invention is a polymer which has at least one of the structural unit represented by Formula (I) or the structural unit represented by Formula (II).

The specific acryl resin of the invention has a side chain structure that is represented by Formula (I) or Formula (II). In other words, since the specific acryl resin has bulky aromatic groups at both sides of the sulfonamide linking group, and at least one of the aromatic groups is a heteroaromatic group, chemical resistance of a formed image area is further improved when the specific acryl resin is included in the lower recording layer.

In Formula (I) and Formula (II), $R^1$ represents a hydrogen atom or an alkyl group; Z represents —O—or —N($R^2$)—, in which $R^2$ represents a hydrogen atom, an alkyl group, an alkenyl group, or an alkynyl group; $Ar^1$ and $Ar^2$ each independently represent an aromatic group, and at least one of them is a heteroaromatic group; and a and b each independently represent 0 or 1.

In Formula (I), $R^1$ represents a hydrogen atom or an alkyl group. The alkyl group is a substituted or unsubstituted alkyl group, and an unsubstituted alkyl group is preferable. Examples of the alkyl group represented by $R^1$ include a lower alkyl group such as a methyl group, an ethyl group, a propyl group, or a butyl group. $R^1$ preferably represents a hydrogen atom or a methyl group.

Z represents —O—or —N($R^2$)—, and preferably represents —N($R^2$)—, in which $R^2$ represents a hydrogen atom, an alkyl group, an alkenyl group, or an alkynyl group, preferably represents a hydrogen atom or an alkyl group having no substituent group, and preferably represents a hydrogen atom.

In Formula (I), a and b each independently represent 0 or 1. Examples of preferred embodiments include a case in which a is 0 and b is 1, a case in which both a and b are 0, and a case in which both a and b are 1. Most preferably, it is a case in which both a and b are 1.

More specifically, when a is 0 and b is 1 in the structural unit described above, Z is preferably O. Further, when both a and b are 1, Z is preferably —N($R^2$)—, in which $R^2$ is preferably a hydrogen atom.

$Ar^1$ and $Ar^2$ each independently represent an aromatic group, and at least one of them is a heteroaromatic group. $Ar^1$ is a divalent aromatic group and $Ar^2$ is a monovalent aromatic group. These aromatic groups are the substituent groups each of which is formed by substitution of one or two aromatic ring-constituting hydrogen atoms with a linking group.

Examples of the aromatic group include a hydrocarbon aromatic group selected from the group consisting of benzene, naphthalene, and anthracene, or a heteroaromatic ring selected from the group consisting of furan, thiophene, pyrrole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazeine, and 1,2,3-triazine.

Furthermore, the aromatic group may be a condensed ring formed using two or more of the above-mentioned rings, such as benzofuran, benzothiophene, indole, indazole, benzoxazole, quinoline, quinazoline, benzimidazole, or benzotriazole.

The aromatic group or heteroaromatic group may additionally have a substituent group, and examples of the substituent group which may be introduced include an alkyl group, a cycloalkyl group, an alkenyl group, a cycloalkenyl group, an aryl group, a heteroaryl group, a hydroxy group, —SH, a carboxyl group or an alkyl ester thereof, a sulfonic acid group or an alkyl ester thereof, a phosphinic acid group or an alkyl ester thereof, an amino group, a sulfonamide group, amide group, a nitro group, halogen atom, and a substituent group in which plural of these groups are bound. The substituent group may additionally have the substituent group exemplified above.

$Ar^2$ is preferably a heteroaromatic group which may have a substituent group. More preferably, it is selected from a nitrogen atom-including heteroaromatic ring selected from the group consisting of pyridine, pyridazine, pyrimidine, pyrazine, 1,3,5-triazine, 1,2,4-triazine, 1,2,3-triazine, tetrazole, oxazole, isoxazole, thiazole, isothiazole, thiadiazole, and oxadiazole.

Hereinbelow, examples of the monomer capable of forming the structural unit represented by Formula (I) or Formula (II) (that is, exemplified monomers (1) to (27)) are shown, but the invention is not limited to them. Among the monomers exemplified below, a monomer having a linking group of —$SO_2$—NH—from the main chain side (for example, monomer (1)) is a monomer capable of serving as the structural unit represented by Formula (I) and a monomer having a linking group of —NH—$SO_2$—(for example, monomer (12)) is a monomer capable of serving as the structural unit represented by Formula (II).

Monomer (1)

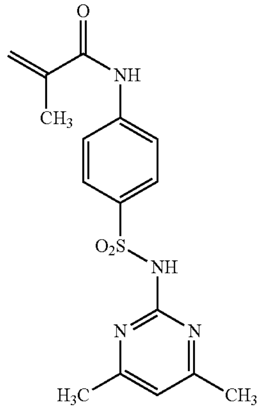

-continued

Monomer (2)

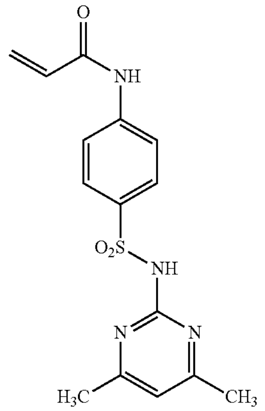

Monomer (3)

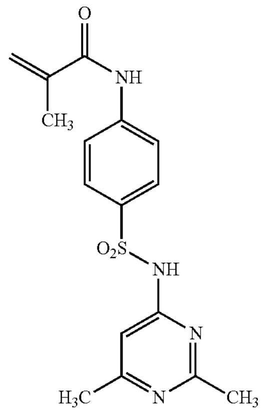

Monomer (4)

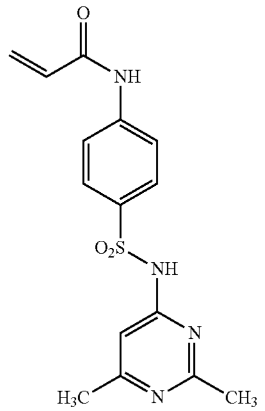

Monomer (5)

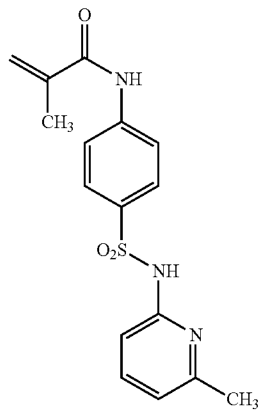

-continued
Monomer (6)
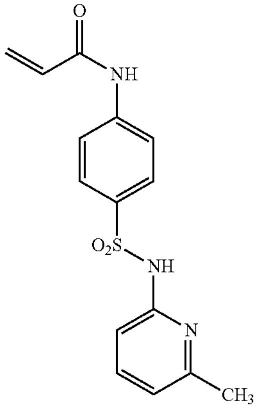
Monomer (7)
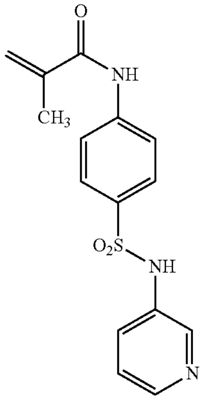
Monomer (8)
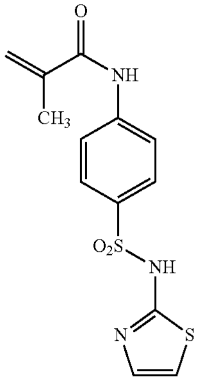
Monomer (9)
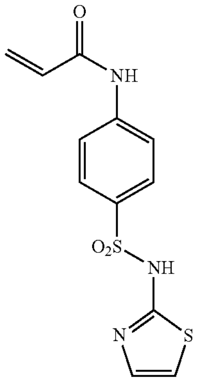
-continued
Monomer (10)
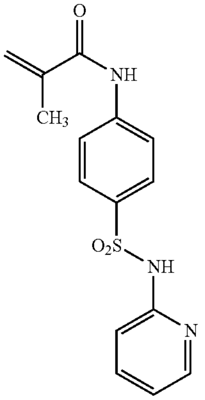
Monomer (11)
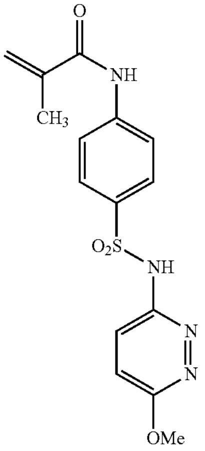
Monomer (12)
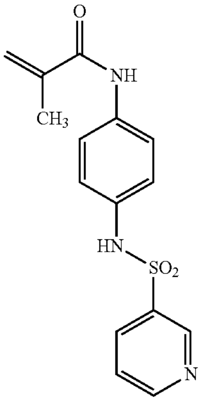

-continued
Monomer (13)
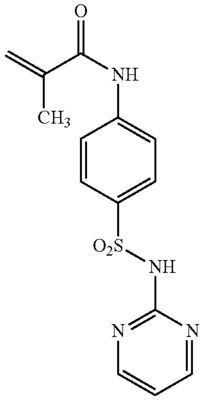
Monomer (14)
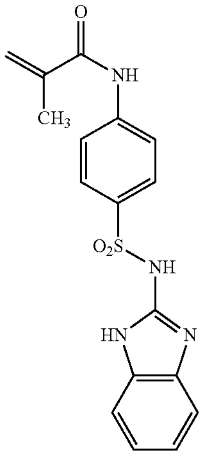
Monomer (15)
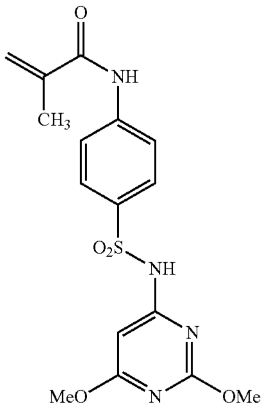
-continued
Monomer (16)
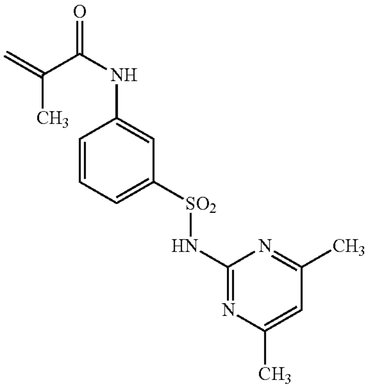
Monomer (17)
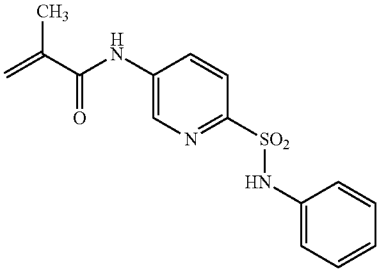
Monomer (18)
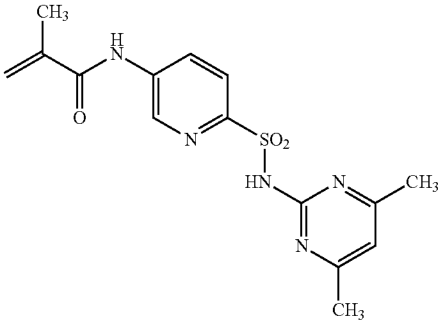
Monomer (19)
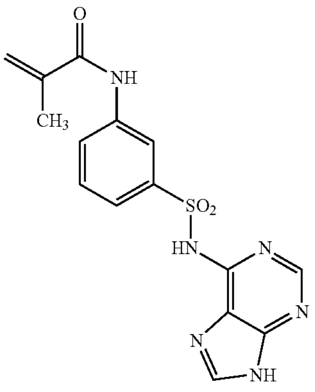

-continued

Monomer (20)

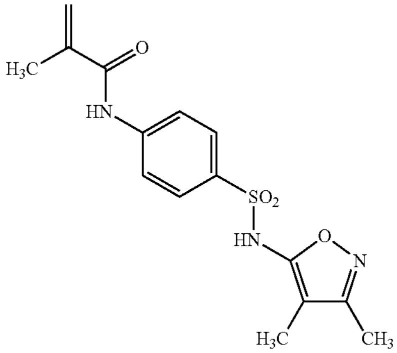

Monomer (21)

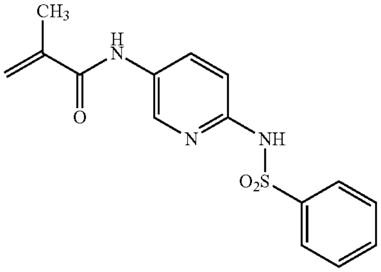

Monomer (22)

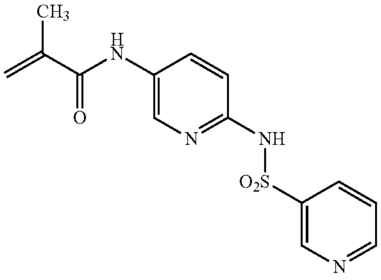

Monomer (23)

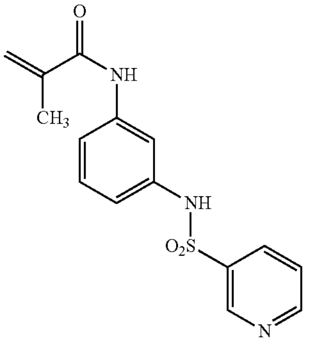

Monomer (24)

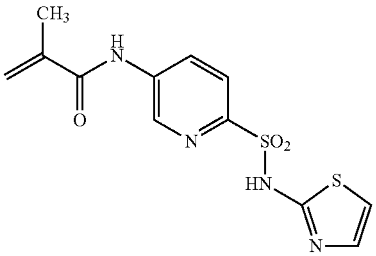

-continued

Monomer (25)

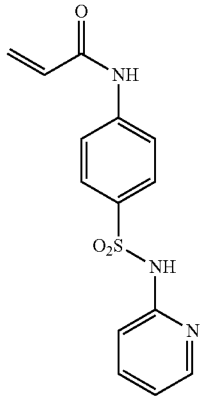

Monomer (26)

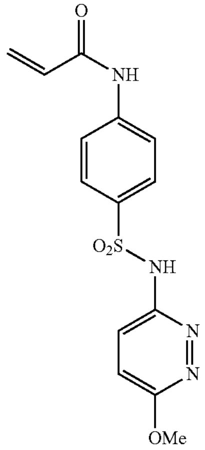

Monomer (27)

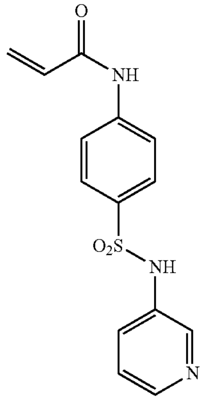

The specific acryl resin is an alkali-soluble polymer which has the structural unit represented by Formula (I) or Formula (II). Further, the structural unit represented by Formula (I) or Formula (II) included in the specific acryl resin may be only one type, or two or more types of them may be used in combination.

The content of the structural unit represented by Formula (I) or Formula (II) included in the specific acryl resin is preferably from 10 mol % to 100 mol %, more preferably from 20 mol % to 90 mol %, still more preferably from 30 mol % to 80 mol %, and most preferably from 30 mol % to 70 mol %.

The specific acryl resin including the structural unit(s) may be a copolymer which includes other structural unit(s), in addition to the structural unit(s) represented by Formula (I) and/or Formula (II).

Examples of other structural unit(s) include a structural unit derived from a hydrophobic monomer having a substituent group such as an alkyl group or an aryl group in a side chain of the monomer, and a structural unit derived from a hydrophilic monomer having an acidic group, an amide group, a hydroxy group, or an ethylene oxide group in a side chain of the monomer. It can be appropriately selected from them depending on purpose. However, selection of a copolymerization monomer needs to be made within the range that the alkali solubility of the specific aryl resin is not impaired.

Examples of other copolymerization component which may be used for the specific acryl resin of the invention include (meth)acrylamide, N-substituted (meth)acrylamide, N-substituted maleimide, (meth)acrylic acid ester, (meth) acrylic acid ester having a polyoxyethylene chain, 2-hydroxyethyl (meth)acrylate, styrene, styrene sulfonic acid, o-, p-, or m-vinyl benzene acid, vinyl pyridine, N-vinyl caprolactam, N-vinyl pyrrolidine, (meth)acrylic acid, itaconic acid, maleic acid, glycidyl (meth)acrylate, hydrolyzed vinyl acetate, and vinyl phosphonic acid. Of these, preferred examples of the copolymerization component include N-benzyl(meth)acrylamide and (meth)acrylic acid.

The number average molecular weight (Mn) of the specific acryl resin is preferably in the range of from 10,000 to 500,000, more preferably in the range of from 10,000 to 200,000, and most preferably in the range of from 10,000 to 100,000. The weight average molecular weight (Mw) of the specific acryl resin is preferably in the range of from 10,000 to 1,000,000, more preferably in the range of from 20,000 to 500,000, and most preferably in the range of from 20,000 to 200,000. The method for measuring the molecular weights will be specifically described in the examples.

Constitution examples of the specific acryl resin which may be preferably used in the invention are given below based on combination of each structural unit.

Copolymer (1)

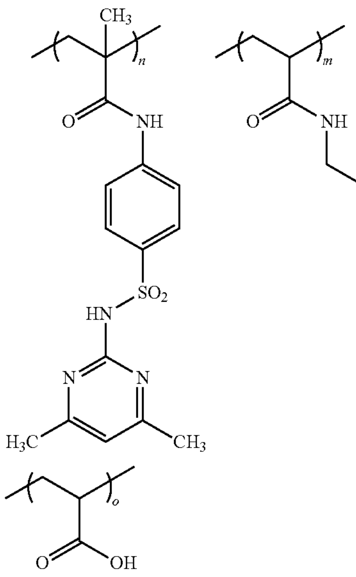

-continued

Copolymer (2)

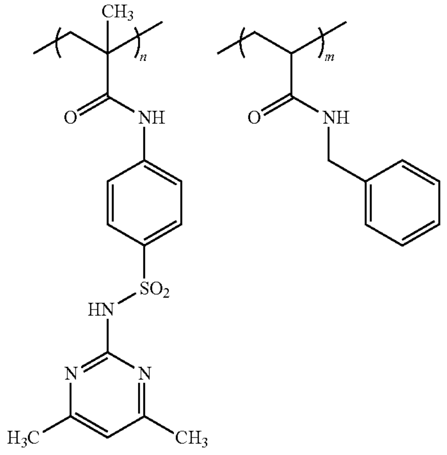

Copolymer (3)

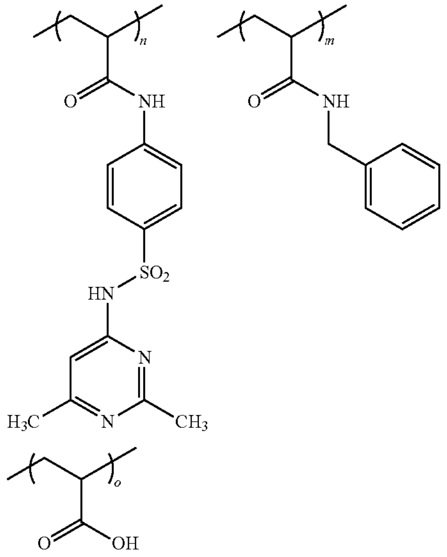

Copolymer (4)

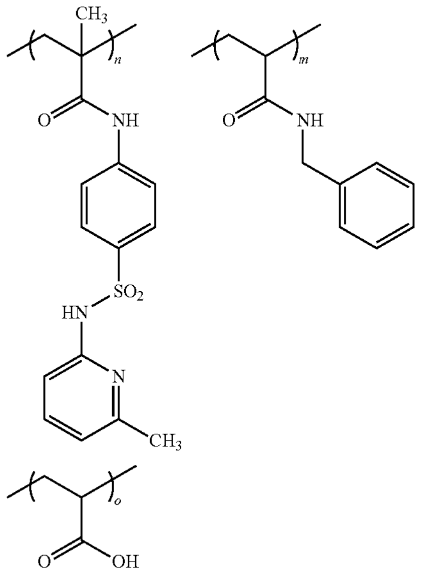

-continued
Copolymer (5)
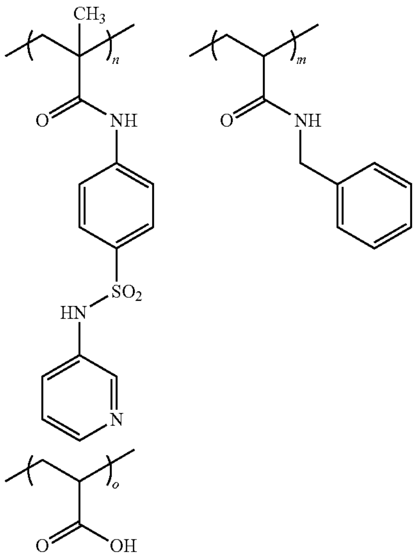
Copolymer (6)
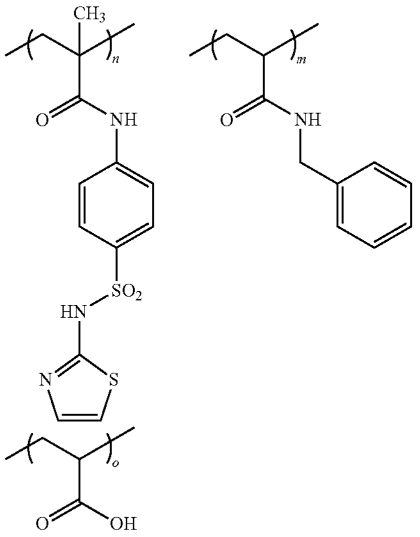
Copolymer (7)
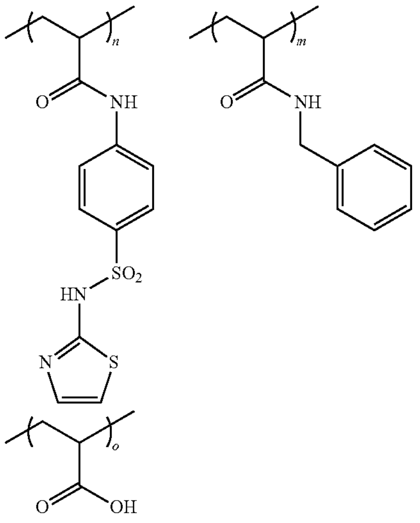
-continued
Copolymer (8)
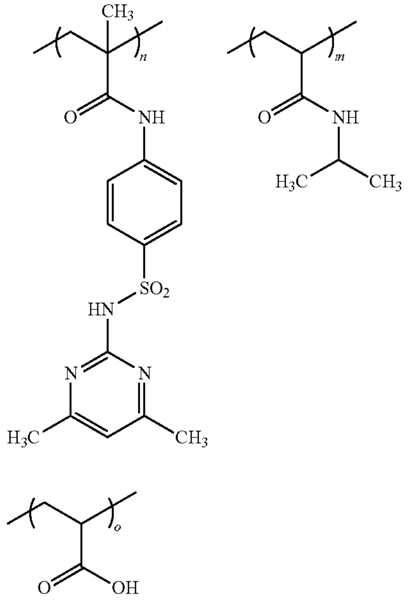
Copolymer (9)
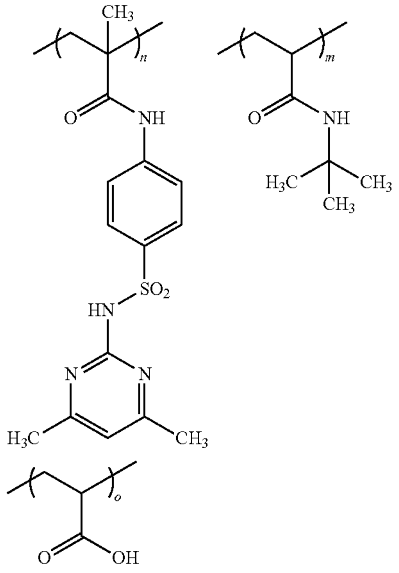
Copolymer (10)
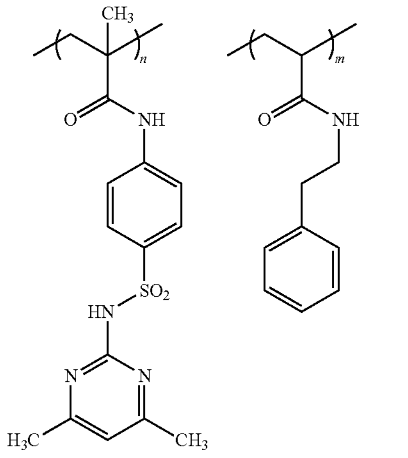

-continued
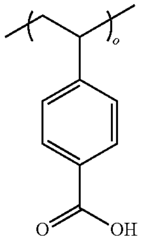
Copolymer (11)
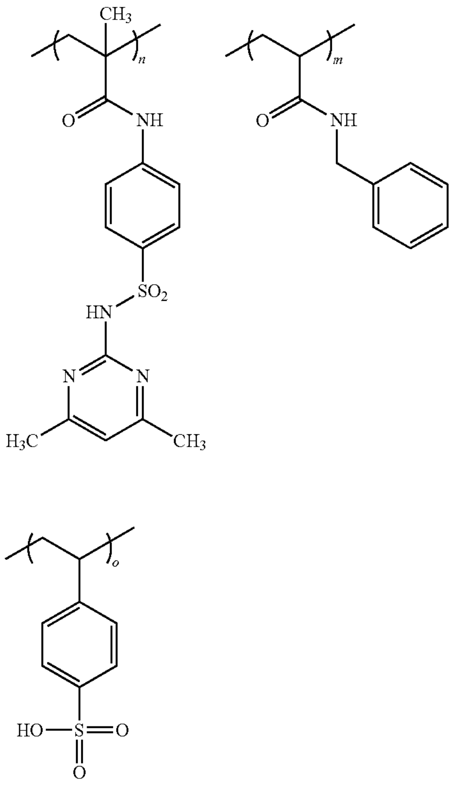
Copolymer (12)
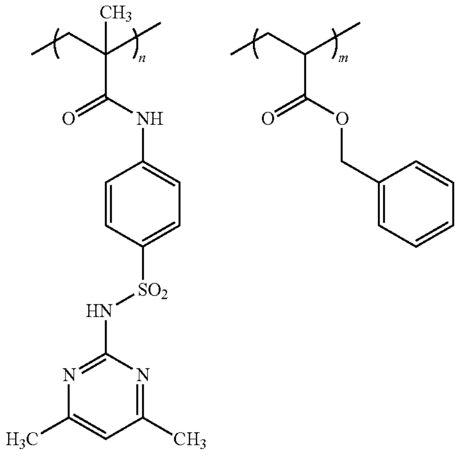
-continued
Copolymer (13)
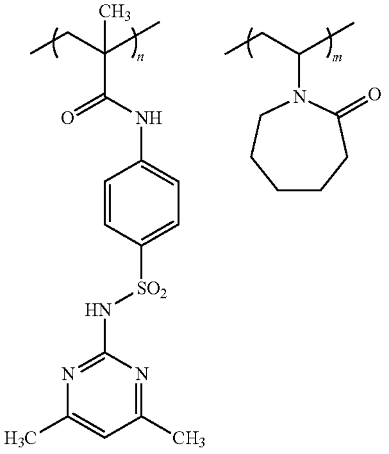
Copolymer (14)
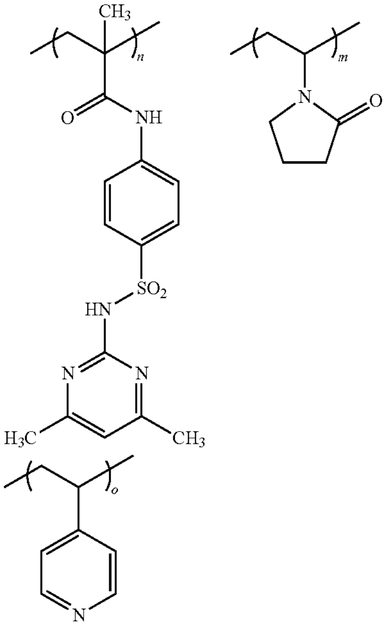
Copolymer (15)
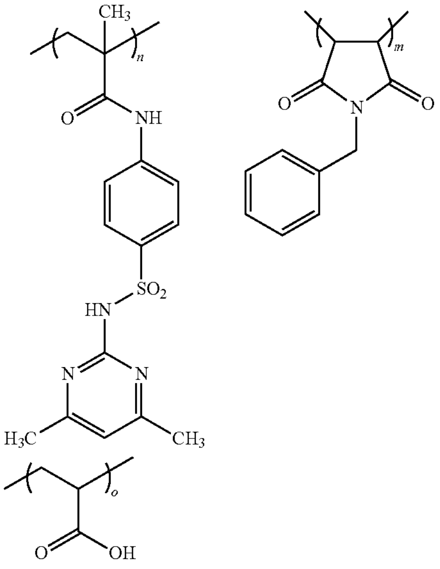

-continued

Copolymer (16)

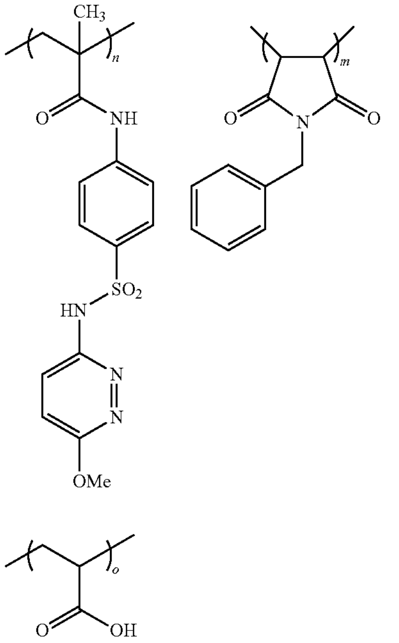

Copolymer (17)

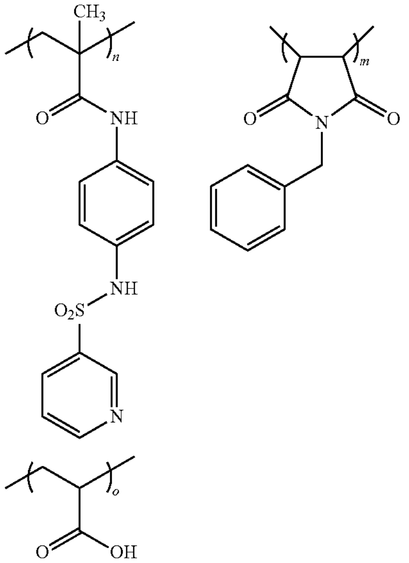

Copolymer (18)

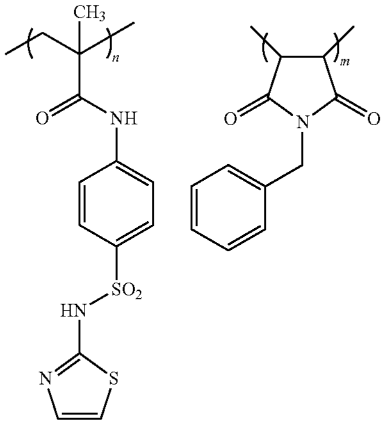

-continued

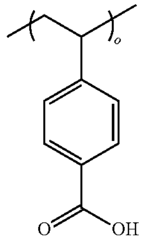

Copolymer (19)

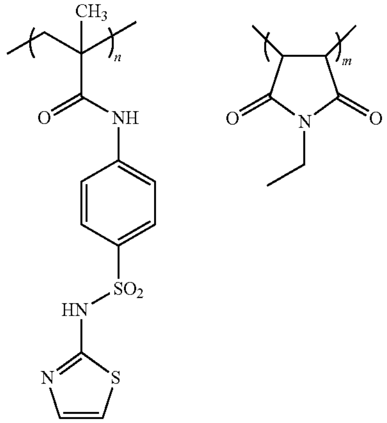

Copolymer (20)

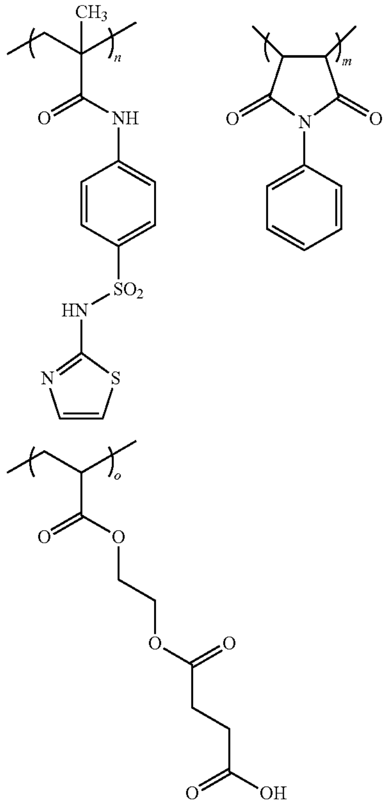

Copolymer (21): a copolymer in which the structural unit derived from acrylic acid in Copolymer (15) is substituted with a structural unit derived from N-(4-hydroxy-3,5-dimethyl-benzyl acrylamide).

In Copolymers (1) to (21), m, n, and o represent polymerization molar ratios of respective structural units, and preferably, n is from 10 mol % to 90 mol %, m is from 5 mol % to 80 mol %, and o is from 0 mol % to 50 mol %, and m+n+o=100.

Specific examples of the specific acryl resin according to the invention are given below based on reacting monomers [that is, monomers for the specific acryl resin] and its polymerization molar ratio. However, the invention is not limited to them. Further, the specific acryl resins according to the invention formed from these monomers are referred to as "specific acryl resin (1)" to "specific acryl resin (8)".

Monomers for Specific Acryl Resin (1)

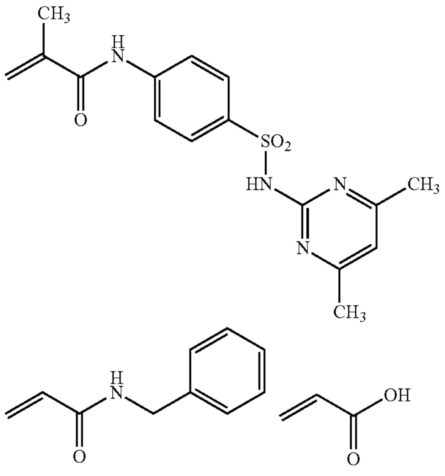

Monomer ratio (mol%): 50/40/10

Monomers for Specific Acryl Resin (2)

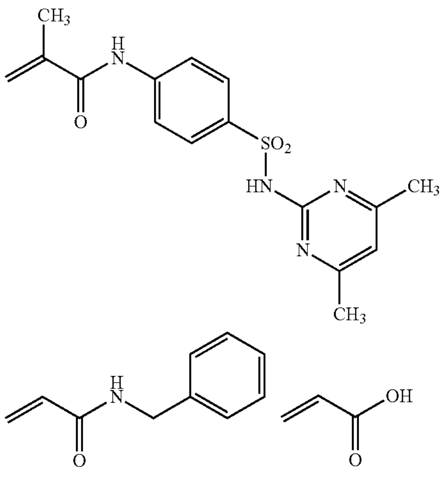

Monomer ratio (mol%): 54/44/2

Monomers for Specific Acryl Resin (3)

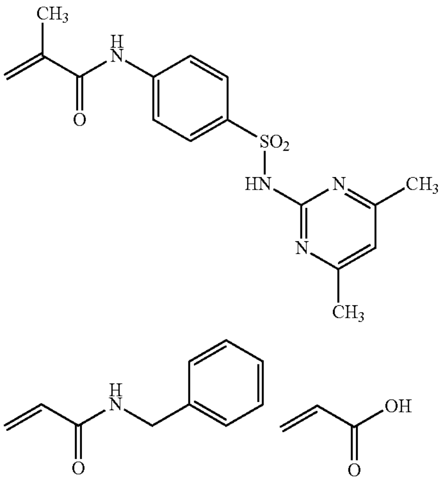

Monomer ratio (mol%): 40/50/10

Monomers for Specific Resin (4)

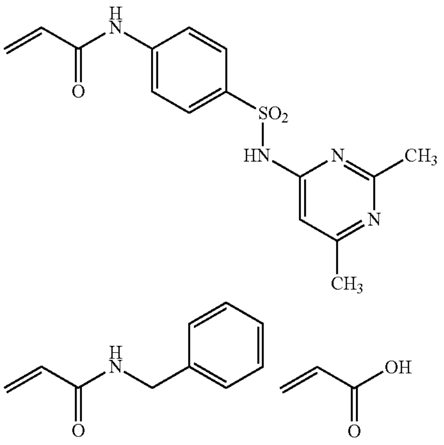

Monomer ratio (mol5): 54/44/2

Monomers for Specific Resin (5)

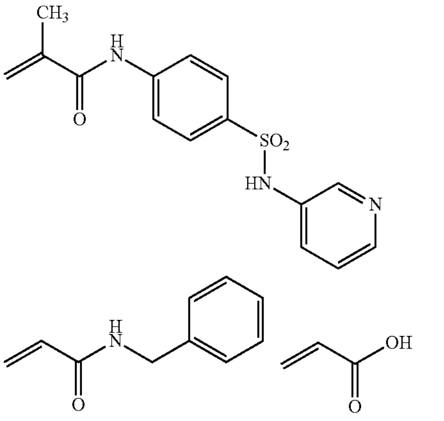

Monomer ratio (mol%): 54/44/2

Monomers for Specific Resin (6)

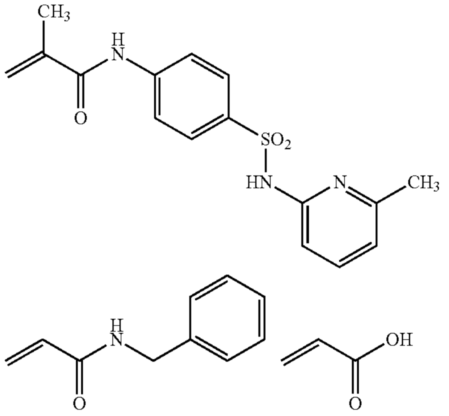

Monomer ratio (mol%): 54/44/2

Monomers for Specific Acryl Resin (7)

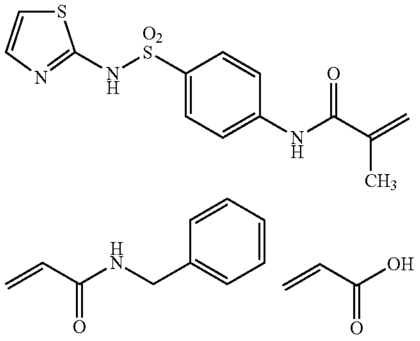

Monomer ratio (mol%): 40/50/10

Monomer for Specific Acryl Resin (8)

Exemplary monomer (1)/N-(4-hydroxy-3,5-dimethyl-benzyl acrylamide)/N-benzyl maleimide Monomer ratio (mol %): 33.8/35/31.2

The aforementioned alkali-soluble resin such as the specific acryl resin is used preferably in an addition amount of from 1% by mass to 99% by mass, more preferably in an addition amount of from 5% by mass to 70% by mass, and most preferably in an addition amount of from 10% by mass to 50% by mass, with respect to the total solid content in the lower recoding layer. By having the addition amount of the alkali-soluble resin in the lower recording layer within the above ranges, the image area of the formed positive-working recording layer has better strength and also developability of the non-image area is improved.

According to the invention, the positive-working recording layer closest to the support may include various alkali-soluble resins. However, when the specific acryl resin is included, the mixing ratio between the alkali-soluble polymer compound other than the specific acryl resin and the specific acryl resin is, in terms of mass ratio between other alkali soluble polymer compound and the specific acryl resin, preferably from 1.0:0.1 to 1.0:8.0, and more preferably from 1.0:0.2 to 1.0:7.0.

Constitutional elements of the planographic printing plate precursor of the invention will be described in greater detail. First, the positive-working recording layer will be described. The positive-working recording layer includes a resin and an infrared absorbing agent (that is, a water-insoluble and alkali-soluble polymer compound or a compound which is capable of suppressing alkali solubility), whereby an image is formed as the dissolution inhibiting property is resolved owing to the infrared laser exposure and solubility for an alkali developer is enhanced.

According to the invention, the water-insoluble and alkali-soluble polymer compound (that is, alkali soluble resin) used in plural positive-working recording layers include a homopolymer including an acidic group in a main chain and/or a side chain of the polymer, a copolymer thereof, and a mixture thereof. Thus, the recording layer according to the invention has a characteristic that it dissolves when brought into contact with an alkaline developer.

Further, in the upper recording layer of the planographic printing plate precursor of the invention, (B) the specific polymer compound including a specific surface orienting group and alkali soluble group is included as essential components, and the aforementioned another alkali soluble resin may be included within the range that the effect of the invention is not impaired.

Next, respective compounds included in the lower recording layer will be described.

Acid Generating Agent

The lower recoding layer may include, in order to improve the solubility of an alkali-soluble resin to an alkali solution in an exposed region, an acid generating agent capable of being decomposed by light or heat to generate an acid.

The acid generating agent refers to a compound capable of generating an acid by irradiation with light having a wavelength of 200 nm to 500 nm or by heating at 100° C. or more. Specific examples of the acid generating agent include a photoinitiator for photo-cationic polymerization, a photoinitiator for photo-radical polymerization, a photo-achromatizing agent such as colorants, a photo-discoloring agent, known acid generating agents used for micro-resist and the like; known compounds which are thermally decomposed to generate an acid; and mixtures thereof. The acids that may be generated are preferably strong acids having a pKa of 2 or less such as sulfonic acid or hydrochloric acid.

Examples of initiators that may be advantageously used in the invention include the triazine compounds described in JP-A No. 11-95415 and the latent Bronsted acids described in JP-A No. 7-20629. As used herein, the latent Bronsted acid means a precursor which is decomposed to generate a Bronsted acid. It is believed that the Bronsted acid catalyzes a matrix generating reaction between a resol resin and a Novolac resin. Examples of the Bronsted acid suitable to this purpose include trifluoromethane sulfonic acid and hexafluorophosphonic acid.

Of the latent Bronsted acids, an ionic latent Bronsted acid is preferably used in the invention. Examples of the ionic latent Bronsted acid include onium salts, in particular, iodonium, sulfonium, phosphonium, selenonium, diazonium and arsonium salts. Examples of particularly useful onium salts include diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyldiazonium hexafluorophosphate.

A non-ionic latent Bronsted acid may be also preferably used in the invention. Examples thereof include a compound represented by the following formulae: $RCH_2X$, $RCHX_2$, $RCX_3$, $R(CH_2X)_2$, and $R(CH_2X)_3$, and in the formulae, X represents Cl, Br, F, or $CF_3SO_3$, and R represents an aromatic group, an aliphatic group, or a combination of an aromatic group and an aliphatic group.

Useful ionic latent Bronsted acids are those represented by the following formula.

$X^+R^1R^2R^3R^4W^-$

In the above formula, when X is iodine, $R^3$ and $R^4$ each represent a lone electron pair and $R^1$ and $R^2$ each represent an aryl group or a substituted aryl group. When X is S or Se, $R^4$ represents a lone electron pair and $R^1$, $R^2$ and $R^3$ each may represent an aryl group, a substituted aryl group, an aliphatic group or a substituted aliphatic group. When X is P or As, $R^4$ may represent an aryl group, a substituted aryl group, an aliphatic group or a substituted aliphatic group. W represents $BF_4$, $CF_3SO_3$, $SbF_6$, $CCl_3CO_2$, $ClO_4$, $AsF_6$, $PF_6$ or any corresponding acid having a pH of less than 3. All the onium salts described in U.S. Pat. No. 4,708,925 may also be used as the latent Bronsted acids in the invention. Examples of the onium salts include indonium, sulfonium, phosphonium, bromonium, chloronium, oxysulfoxonium, oxysulfonium, sulfoxonium, selenonium, telluronium and arsonium salts.

In the invention, it is particularly preferable to use a diazonium salt as the latent Bronsted acid. When a diazonium salt is used, a sensitivity equivalent to that when other latent Bronsted acids are used is attained in an infrared region, and also a higher sensitivity is attained in an ultraviolet region.

In the invention, the content of the acid generating agent is preferably from 0.01% by mass to 50% by mass, more preferably from 0.1% by mass to 25% by mass and even more preferably 0.5% by mass to 20% by mass, with respect to the total solids content of the lower recording layer, in terms of image formability and prevention of scumming in non-image area.

In the positive-working recording layer of the invention, a variety of known additives may be included in combination depending on purpose, in addition to each constitutional component described above. In plural recording layers, the upper recoding layer is required to include the (B) specific alkali-soluble polymer compound and it preferably includes (A) an infrared absorbing agent. However, as for other additives, the same additives may be used for the upper recording layer and also other recording layer (the lower recording layer).

Other Additives

Dissolution Inhibiting Agent

In the lower recording layer or other recording layer of the invention further, if necessary, a material (that is, dissolution inhibiting agent), such as low-molecular-weight onium salt compounds, o-quinone diazide compounds, aromatic sulfone compounds, or aromatic sulfonic acid ester compounds, which is a pyrolytic substances and substantially deteriorate the solubility of alkali-soluble resin when they are undecomposed can be used in combination. The addition of a dissolution inhibiting agent improves the preventive effect on the dissolution of the image area into the developer. In addition, addition of an inhibiting agent not forming an interaction with an alkali-soluble polymer compound as an infrared absorbing agent is also possible. Examples of the onium salts which may be used as a dissolution inhibiting agent in the invention include diazonium salt compounds, ammonium salt compounds, phosphonium salt compounds, iodonium salt compounds, sulfonium salt compounds, selenonium salt compounds, and arsonium salt compounds.

Preferred examples of the low-molecular-weight onium salts that may be used as a dissolution inhibiting agent in the invention include diazonium salts as disclosed in S. I. Schlesinger, Photogr. Sci. Eng., 18, 387 (1974), T. S. Bal et al., Polymer. 21, 423 (1980), and Japanese Patent Application Laid-Open (JP-A) No. 5-158230; ammonium salts as disclosed in U.S. Pat. Nos. 4,069,055 and 4,069,056, and Japanese Patent Application Laid-Open (JP-A) No. 3-140140; phosphonium salts as disclosed in D. C. Necker et al., Macromolecules, 17, 2468 (1984), C. S. Wen et al., Teh, Proc. Conf. Rad. Curing ASIA, p 478 Tokyo, October (1988), and U.S. Pat. Nos. 4,069,055 and 4,069,056; iodonium salts as disclosed in J. V. Crivello et al., Macromorecules, 10 (6), 1307 (1977), Chem. & Eng. News, November 28, p 31 (1988), EP Patent No. 104,143, U.S. Pat. Nos. 5,041,358 and 4,491,628, and Japanese Patent Application Laid-Open (JP-A) Nos. 2-150848 and 2-296514;

sulfonium salts as disclosed in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromorecules, 14 (5), 1141 (1981), J. V. Crivello et al., J. Polymer Sci., Polymer Chem. Ed., 17, 2877 (1979), EP Nos. 370,693, 233, 567, 297,443, and 297,442, U.S. Pat. Nos. 4,933,377, 3,902,114, 4,491,628, 5,041,358, 4,760,013, 4,734,444, and 2,833,827, and German Patent Nos. 2,904,626, 3,604,580, and 3,604,581; selenonium salts as disclosed in J. V. Crivello et al., Macromorecules, 10 (6), 1307 (1977), J. V. Crivello et al., J. Polymer Sci., and Polymer Chem. Ed., 17, 1047 (1979); and arsonium salts as disclosed in C. S. Wen et al., Teh, Proc. Conf. Rad. Curing ASIA, p 478 Tokyo, October (1988).

Diazonium salts are particularly preferred as a dissolution inhibiting agent that may be used in the invention. The particularly preferred diazonium salts include those described in Japanese Patent Application Laid-Open (JP-A) No. 5-158230.

Examples of the counter ion of onium salts include tetrafluoroboric acid, hexafluorophosphoric acid, triisopropylnaphthalene sulfonic acid, 5-nitro-o-toluenesulfonic acid, 5-sulfosalicylic acid, 2,5-dimethylbenzene sulfonic acid, 2,4,6-trimethylbenzenesulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and paratoluene sulfonic acid. Among them, particularly preferred are alkyl aromatic sulfonic acids such as hexafluorophosphoric acid, triisopropyl naphthalene sulfonic acid, or 2,5-dimethylbenzene sulfonic acid.

Preferable examples of the quinone diazides include an o-quinone diazide compound. The o-quinone diazide compound for use in the invention is a compound which has at least one o-quinone diazide group and is thermally decomposed to increase the alkali-solubility, and compounds having various structures may be used. In other words, the o-quinone diazide compound enhances the solubility of the photosensitive system by both of the effect that the function of suppressing the dissolution of the binder is lost by the thermal decomposition of the o-quinone diazide and the effect that the o-quinone diazide itself changes to an alkali soluble material.

Examples of the o-quinone diazide compound that may be used in the invention include compounds described in J. Koser, "Light-Sensitive Systems" (John Wiley & Sons. Inc.), pp. 339-352. Sulfonic acid esters or sulfonic acid amides of o-quinone diazide formed by allowing reacting o-quinone diazide with various aromatic polyhydroxy compounds or with aromatic amino compounds are particularly preferable. Preferable examples of the o-quinone diazide compound further include an ester of benzoquinone-(1,2)-diazide sulfonic acid chloride or naphthoquinone-(1,2)-diazide-5-sulfonic acid chloride and a pyrogallol-acetone resin, as described in Japanese Patent Publication (JP-B) No. 43-28403; and an ester of benzoquinone-(1,2)-diazide sulfonic acid chloride or naphthoquinone-(1,2)-diazide-5-sulfonic acid chloride and a phenol-formaldehyde resin, as described in U.S. Pat. Nos. 3,046,120 and 3,188,210.

Further examples of the o-quinone diazide compound that may be preferably used include an ester of naphthoquinone-(1,2)-diazide-4-sulfonic acid chloride and a phenol-formaldehyde resin or cresol-formaldehyde resin; and an ester of naphthoquinone-(1,2)-diazide-4-sulfonic acid chloride and a pyrogallol-acetone resin. Other useful o-quinone diazide compounds are reported in many patent documents, examples of which include Japanese Patent Application Laid-Open (JP-A) Nos. 47-5303, 48-63802, 48-63803, 48-96575, 49-38701, 48-13354, Japanese Patent Publication (JP-B) Nos. 41-11222, 45-9610, 49-17481, U.S. Pat. Nos. 2,797,213, 3,454,400, 3,544,323, 3,573,917, 3,674,495, 3,785,825, U.K. Patent Nos. 1,227,602, 1,251,345, 1,267,005, 1,329,888, 1,330,932, and German Patent No. 854,890.

The o-quinone diazide compound is preferably added in an amount of from 1 to 50% by mass, more preferably from 5 to 30% by mass and most preferably from 10 to 30% by mass, based on the total solids content of each recording layer. These compounds may be used singly, or may be used as a mixture of two or more thereof.

The additives other than the o-quinone diazide compound are preferably added in an amount of from 1 to 50% by mass, more preferably from 5 to 30% by mass and most preferably from 10 to 30% by mass.

The additives and binder used in the invention are preferably contained in the same layer.

Cyclic Acid Anhydrides, Phenols, and Organic Acids

In order to further increase the sensitivity, the recording layer may further contain a cyclic acid anhydride, a phenolic compound, an organic acid or the like. Examples of the cyclic acid anhydride include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride, as described in U.S. Pat. No. 4,115,128. Examples of the phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',",4"-tetrahydroxy-3,5,3',5'-tetramethyltriphenylmethane. Examples of the organic acid include sulfonic acids, sulfinic acids, alkylsulfuric acids, phosphonic acids, phosphates, and carboxylic acids, as described in Japanese Patent Application Laid-Open (JP-A) Nos. 60-88942 and 2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The content (total content) of the cyclic acid anhydride, the phenol compound and the organic acid in the material of the printing plate is preferably from 0.05 to 20% by mass, more preferably from 0.1 to 5% by mass, and most preferably from 0.1 to 10% by mass.

Coloring Agent

For example, a dye having a large absorption in the visible light range may be further added as a coloring agent for an image to the recording layer of the invention. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (all trade names, manufactured by Orient Chemical Industries Co., Ltd.); and Victoria Pure Blue, Crystal Violet (CI-42555), Methyl Violet (CI-42535), Ethyl Violet, Rhodamine B (CI-145170B), Malachite Green (CI-42000), Methylene Blue (CI-52015), and Aizen Spilon Blue C-RH (all trade names, manufactured by Hodogaya Chemical Co., Ltd.), and dyes described in JP-A No. 62-293247.

It is preferable to add the dye since the distinction between an image area and a non-image area after an image becomes clear after formation of the image. The amount of the dye to be added is preferably in the range of from 0.01 to 10% by mass based on the total solids content of the recording layer.

Surfactant

In order to increase the processing stability relating to development conditions, nonionic surfactants as described in JP-A Nos. 62-251740 and 3-208514, amphoteric surfactants as described in JP-A Nos. 59-121044 and 4-13149, siloxane compounds as described in EP 950517, or copolymers of fluorine-containing monomers as described in JP-A No. 11-288093 may be added to the recording layer of the invention.

Specific examples of nonionic surfactants include sorbitan tristearate, sorbitan monopalmitate, sorbitan trioleate, stearyl acid monoglyceride and polyoxyethylene nonyl phenyl ether. Specific examples of amphoteric surfactants include alkyl di(aminoethyl)glycine, alkyl polyaminoethylglycine hydrochloride, 2-alkyl-N-carboxyethyl-N-hydroxyethylimidazolinium betaine and N-tetradecyl-N,N-betaine surfactants (for example, "AMOGEN K" (trade name), manufactured by Daiichi Kogyo Seiyaku Co., Ltd.). The siloxane compounds are preferably block copolymers of dimethylsiloxane and polyalkylene oxide. Specific examples thereof include polyalkylene oxide modified silicones such as DBE-224, DBE-621, DBE-712, DBP-732 and DBP-534 (all trade names, manufactured by Chisso Corporation) or Tego Glide 100 (trade name, manufactured by Evonik Tego Chemie GmbH, Germany).

The content (i.e., total content) of the nonionic surfactant and amphoteric surfactant is preferably from 0.05 to 15% by mass, and more preferably from 0.1 to 5% by mass, in the recording layer.

Print-Out Agent

A print-out agent which is a material for obtaining a visible image immediately after heating by exposure to light, or a dye or pigment as an image coloring agent may be added to the planographic printing plate precursor in the invention. A typical example of the print-out agent is a combination of an organic dye capable of forming a salt with a compound capable of releasing an acid due to heating upon exposure to light (photo-acid releasing agent).

Specific examples of the combination include combinations of o-naphthoquinone diazide-4-sulfonic acid halogenides with salt-formable organic dyes, as described in JP-A Nos. 50-36209 and 53-8128; and combinations of trihalomethyl compounds with salt-formable organic dyes, as described in Japanese Patent Application Laid-Open (JP-A) Nos. 53-36223, 54-74728, 60-3626, 61-143748, 61-151644 and 63-58440. The trihalomethyl compounds are classified into oxazol compounds and triazine compounds. Both of the compounds have excellent stability over the lapse of time and produce a clear print-out image. Other examples of the photo-acid releasing agent include various o-naphthoquinone diazide compounds as described in Japanese Patent Application Laid-Open (JP-A) No. 55-62444, 2-trihalomethyl-5-aryl-1,3,4-oxadiazole compounds as described in Japanese Patent Application Laid-Open (JP-A) No. 55-77742, and diazonium salts.

Plasticizer

A plasticizer may optionally be added to the recording layer-forming coating liquid in the invention in order to impart flexibility to the coated film. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid may be used.

Method for Producing Planographic Printing Plate Precursor

Hereinbelow, a preferred method for producing the planographic printing plate precursor of the invention will be described.

According to the invention, the lower recording layer (other recording layer) is first formed on a hydrophilic support. The lower recording layer may be obtained by preparing a coating liquid composition for forming a lower recording layer by dissolving and dispersing, in an appropriate solvent system, the alkali-soluble polymer compound (preferably, containing the specific acryl resin), an infrared absorbing agent which is used if desired, and other constitutional components, followed by coating and drying the composition.

Examples of the appropriate solvent which may be used for coating the recording layer include, although not particularly limited, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene. These solvents may be used alone, or in combination of two or more thereof. The concentration of the components (i.e., the total solid contents including additives) in the solvent is preferably from 1 to 50% by mass.

It is preferable that the lower recording layer and the upper recording layer are basically formed into separate layers. Further, it is also possible to form plural lower recording layers. Even for such case, it is preferable that each lower layer is formed into separate layers. Further, for the purpose of improving adhesion property between layers, interface of each layer may be intentionally compatibilized.

Examples of the method of separately forming two layers from each other include a method which makes use of a difference between the solvent solubility of the ingredients contained in the lower recording layer and that of the ingredients contained in the upper recording layer, and a method in which a solvent is dried and removed quickly after the upper recording layer is applied. However, the method is not limited thereto. The latter is a method for inhibiting dissolution at interface between layers by removing a solvent included in the upper recording layer, in which the solvent has an effect such as dissolving part of the formed lower recording layer.

An example of the method which makes use of the difference between the solvent solubility of the ingredients contained in the lower recording layer and that of the ingredients contained in the upper recording layer includes a method using a solvent which does not dissolve the alkali-soluble polymer compound contained in the lower recording layer when the coating liquid for the upper recording layer (i.e., an upper recording layer coating liquid) is applied. In this way, coated films formed by two-layer coating are clearly separated from each other. For example, an ingredient that is insoluble to a solvent such as methyl ethyl ketone, diethyl ketone, or 1-methoxy-2-propanol, which is capable of dissolving the alkali-soluble polymer compound as the ingredient in the upper recording layer, is selected as the ingredient of the lower recording layer, the lower recording layer is coated using a solvent system which is capable of dissolving the ingredient contained in the lower recording layer, and the coated film is dried, thereafter, upper recording layer-forming coating liquid containing the alkali-soluble polymer compound as the primary ingredient is dissolved in methyl ethyl ketone, diethyl ketone, or 1-methoxy-2-propanol or the like, and applied and dried, whereby two layers are formed.

When a method using a solvent which does not dissolve the alkali-soluble polymer compound contained in the lower recording layer is used upon application of the upper recording layer-forming coating liquid, a solvent which is capable of dissolving the alkali-soluble polymer compound contained in the lower recording layer may be mixed with a solvent which does not dissolve this alkali-soluble polymer compound as a solvent for the coating liquid of the upper recording layer. The mixing between the upper recording layer and the lower recording layer may be arbitrarily controlled by changing the mixing ratio of both the solvents. If the ratio of the solvent capable of dissolving the alkali-soluble polymer compound contained in the lower recording layer is increased, part of the lower recording layer is dissolved upon application to form the upper recording layer and the dissolved ingredients are contained in the upper recording layer as particulate ingredients after being dried. The particulate ingredients form projections on the surface of the upper recording layer, thereby improving the scratch resistance. On the other hand, the ingredients in the lower recording layer dissolve into the upper recording layer, resulting in a tendency of deterioration in the film quality and chemical resistance of the lower recording layer. By thus controlling the mixing ratio in consideration of physical properties for each layer, various characteristics can be exhibited, and partial compatibility between the layers can also be developed, which will be described hereinafter.

From the viewpoint of the effect of the invention, when a mixed solvent as mentioned above is used as a solvent for the coating liquid of the upper recording layer, the amount of a solvent which is capable of dissolving the alkali-soluble polymer compound in the lower recording layer is preferably 80% by mass or less in terms of the chemical resistance, and more preferably from 10% by mass to 60% by mass in terms of the scratch resistance, based on the total amount of the solvents used for the coating liquid of the upper recording layer.

Then, examples of the method of drying a solvent extremely quickly after the upper recording layer has been formed include a method which involves blowing high pressure air from a slit nozzle arranged approximately perpendicular to the travel direction of a web, a method which involves supplying thermal energy as conductive heat to a web from the underside of the web through a roll (heating roll) into which a heating medium such as steam is supplied, and the combination of these methods.

The method for coating each layer of the recording layer of the invention may use various methods, and examples of these methods include known coating methods such as bar coater coating, rotary coating, spray coating, curtain coating, dip coating, air knife coating, blade coating, or roll coating.

In particular, the coating method used to form the upper recording layer is desirably carried out in a non-contact system to prevent damage to the lower recording layer at the time of coating of the upper recording layer. While bar coating which is a contact system may be used as the method commonly used in a solvent coating, it is desirable to carry out the coating in a forward rotation drive system to prevent damage to the lower recording layer.

The coating weight of the lower recording layer of the planographic printing plate precursor of the invention after drying is preferably from 0.5 $g/m^2$ to 2.0 $g/m^2$, and more preferably from 0.7 $g/m^2$ to 1.5 $g/m^2$, from the viewpoints of ensuring sufficient printing durability and improving solubility discrimination during development. When the lower recording layer includes two or more layers, the preferred coating weight of the lower recording layer represents the total coating weight of plural lower recording layers.

Further, the coating weight of the recording layer (that is, the upper coating layer), which is present at the outermost surface, after drying is preferably in the range of from 0.05 $g/m^2$ to 1.0 $g/m^2$, and more preferably in the range of from 0.07 $g/m^2$ to 0.7 $g/m^2$.

In order to improve coating properties, the coating liquid in the lower recording layer or the upper recording layer of the invention may contain a surfactant such as a fluorine-containing surfactant as disclosed in JP-A No. 62-170950. The content of the surfactant is preferably from 0.01 to 1% by mass, and more preferably from 0.05 to 0.5% by mass, with respect to the total solid content of the coating liquid.

Support

The support used for producing a planographic printing plate precursor of the invention is not specifically limited, as long as it is a three-dimensionally stable plate. Examples of the support include paper, plastic (for example, polyethylene, polypropylene, and polystyrene)-laminated paper, metal sheets (for example, metal sheets made from aluminum, zinc, or copper), plastic films (for example, plastic films made from cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), and paper or plastic films on which the metal has been laminated or deposited.

The support which may be used in the invention is preferably a polyester film or an aluminum plate. Among these, an aluminum plate which has good dimension stability and is relatively inexpensive is particularly preferred. Examples of a suitable aluminum plate include a pure aluminum plate, and an alloy plate which contains aluminum as a main component and a trace amount of other elements. Further the support may be a plastic film on which aluminum has been laminated or deposited. Examples of other elements which may be contained in the aluminum alloy include silicon, iron, manganese, copper, magnesium, chromium, zinc, bismuth, nickel and titanium. The content of other elements in the alloy is preferably 10% by mass or less. In the present invention, although particularly preferred aluminum is pure aluminum, it is difficult to manufacture a completely pure aluminum in terms of refining technology. Therefore, those containing a trace amount of other elements may also be used. In this manner, the formulation of the aluminum plate used in the present invention is not particularly limited, and an aluminum plate made of a material which is conventionally known and in public use may be used as required. The thickness of the aluminum plate used in the present invention is preferably from about 0.1 mm to about 0.6 mm, more preferably from about 0.15 mm to about 0.4 mm, and particularly preferably from about 0.2 mm to about 0.3 mm.

The support used in the invention is required to have a hydrophilic surface at least at the side on which a recording layer is formed. In this regard, since an aluminum support has a roughened surface which has relatively excellent hydrophilicity, no surface hydrophilization is particularly needed when an aluminum support is used. Further, when any of the supports mentioned above is used, that is, including a case of using an aluminum support, it is preferable to subject the support to a surface hydrophilization treatment described below from the viewpoint of improving quality of printed material.

When used as a support, the aluminum plate may be subjected to various kinds of surface treatments such as a roughening treatment or an anodic oxidation treatment.

Before a roughening treatment, an aluminum plate is subjected to, as necessary, a degreasing treatment using, for example, a surfactant, an organic solvent, an aqueous alkaline solution, or the like, thereby removing a rolling oil from the surface of the aluminum plate. The surface roughening treatment for an aluminum plate may be carried out by any one of various methods, such as a method of mechanically roughening the surface, a method of electrochemically dissolving and roughening the surface, or a method of chemically and selectively dissolving the surface. The mechanical method may be selected from known methods such as a ball polishing method, a brush polishing method, a blast polishing method, or a buff polishing method. The electrochemical roughening method may be carried out using an alternating or direct current in a hydrochloric acid or nitric acid electrolytic solution. Alternatively, as disclosed in Japanese Patent Application Laid-Open (JP-A) No. 54-63902, a combination of these methods may be used. The aluminum plate having a roughened surface in this manner is subjected to, as necessary, an alkali etching treatment and a neutralization treatment, and then, as necessary, an anodic oxidation treatment to improve the water retentivity and abrasion resistance of the surface. The electrolyte used for the anodic oxidation treatment of an aluminum plate may be selected from various electrolytes which enable formation of a porous oxide film, and is commonly sulfuric acid, phosphoric acid, oxalic acid, chromic acid, or a mixture of these acids. The electrolyte concentration is appropriately selected according to the type of the electrolyte.

The conditions for the anodic oxidation treatment are not specifically defined, because the conditions may vary depending on the type of electrolyte. In general, it is preferred that the electrolyte concentration be from 1 to 80% by mass, the liquid temperature be from 5 to 70° C., the current density be from 5 to 60 $A/dm^2$, the voltage be from 1 to 100 V, and the electrolysis time be from 10 seconds to 5 minutes. When the amount of the anode oxide coating film is less than 1.0 $g/m^2$, the printing durability may be insufficient, or the non-image areas of the planographic printing plate are susceptible to scratches, which may result in "blemish contamination" caused by ink adhesion to the scratches during printing.

After the anodic oxidation treatment, the surface of the aluminum plate is subjected to, as necessary, a hydrophilizing treatment.

Examples of the method of the hydrophilizing treatment in the invention include a method using an alkali metal silicate (for example, sodium silicate aqueous solution) as disclosed in U.S. Pat. Nos. 2,714,066, 3,181,461, 3,280,734, and 3,902,734. In this method, the support is immersed or electrolyzed in a sodium silicate aqueous solution. Other examples include a method of treating with potassium fluorozirconate as disclosed in Japanese Patent Application Publication (JP-B) No. 36-22063, and a method of treating with polyvinylphosphonic acid as disclosed in U.S. Pat. Nos. 3,276,868, 4,153,461, and 4,689,272.

The planographic printing plate precursor of the invention is formed by overlaying, onto a support, at least two layers of other recording layer (the lower recording layer) and the upper recording layer. If necessary, an undercoat layer may be provided between the support and the lower recording layer.

The component of the undercoat layer may be selected from various organic compounds, and examples thereof include carboxymethyl cellulose, dextrin, gum arabic, aminophosphonic acids such as 2-aminoethylphosphonic acid, organic phosphonic acids such as phenylphosphonic acid which may have a substituent group, naphthylphosphonic acid which may have a substituent group, alkylphosphonic acid which may have a substituent group, glycerophosphonic acid which may have a substituent group, methylenediphosphonic acid which may have a substituent group, or ethylenediphosphonic acid which may have a substituent group, organophosphoric acids such as phenylphosphoric acid which may have a substituent group, naphthylphosphoric acid which may have a substituent group, alkylphosphoric acid which may have a substituent group, or glycerophosphoric acid which may have a substituent group, organic phosphinic acids such as phenylphosphinic acid which may have a substituent group, naphthylphosphinic acid which may have a substituent group, alkylphosphinic acid which may have a substituent group, or glycerophosphinic acid which may have a substituent group, amino acids such as glycine or β-alanine, and hydrochlorides of amine having a hydroxyl group, such as triethanolamine hydrochloride. These compounds may be used alone, or in combination of two or more thereof.

The undercoat layer may be formed by the following method. Specifically, an undercoat layer may be formed by a method in which: any one of the organic compounds is dissolved in water or an organic solvent such as methanol, ethanol, or methyl ethyl ketone, or a mixture of these solvents to make a solution, and this solution is applied to an aluminum plate, followed by drying. Alternatively, an undercoat layer may be formed by a method in which: any one of the organic compounds is dissolved in water or an organic solvent such as methanol, ethanol, or methyl ethyl ketone, or a mixture of these solvents to make a solution, and an aluminum plate is immersed in this solution to adsorb the compound, followed by water washing and drying. In the former method, the concentration of the organic compound in the solution is preferably from 0.005 to 10% by mass. In the latter method, the concentration of the organic compound in the solution is preferably from 0.01 to 20% by mass, and more preferably from 0.05 to 5% by mass; the immersion temperature is preferably from 20° C. to 90° C., and more preferably from 25° C. to 50° C.; and the immersion time is preferably from 0.1 seconds to 20 minutes, and more preferably from 2 seconds to 1 minute. The solution may be adjusted to have a pH of from 1 to 12 using a basic substance such as ammonia, triethylamine, or potassium hydroxide, or an acidic substance such as hydrochloric acid or phosphoric acid. The solution may further contain a yellow dye to improve the tone reproducibility of the image forming material.

The coating weight of the undercoat layer is preferably from 2 mg/m$^2$ to 200 mg/m$^2$, and more preferably from 5 mg/m$^2$ to 100 mg/m$^2$, from the viewpoint of achieving sufficient printing durability.

The positive-working planographic printing plate precursor according to the invention, which may be manufactured as described above, is subjected to an image exposure treatment and a development treatment according to the production method of the invention.

Method for Producing Planographic Printing Plate

A method for manufacturing a planographic printing plate of the present invention includes, in the following order: subjecting a planographic printing plate precursor according to the invention, which may be obtained as described above, to image-wise light exposure (that is, exposure step); and developing the planographic printing plate precursor after the image-wise light exposure with an alkali developer containing at least (C) an ammonium salt compound selected from the group consisting of the compounds represented by Formula (C-1) to Formula (C-3) (that is, development step).

Exposure Step

In the exposure step of the invention, the image-wise light exposure is preferably carried out using, for example, a light source having an emission wavelength from near-infrared to infrared region. In particular, a solid laser or a semiconductor laser which emits an infrared ray having a wavelength of from 760 nm to 1,200 nm is preferred for image-wise exposure of the present invention.

More specifically, light exposure by a solid high-output infrared laser such as a semiconductor laser, a YAG laser, or the like is preferable for forming an image.

Further, image-wise exposure may be carried out by direct image-wise recording through an image-wise mask using a thermal recording head or the like, high-luminosity flash exposure using a xenon discharge lamp or the like, or infrared lamp exposure, or the like.

For image-wise exposure using infrared laser, the output of the laser is preferably 100 mW or higher. In order to shorten the time of exposure, it is preferred to use a multi-beam laser device. The exposure time per one pixel is preferably 20 μsec or shorter. The energy which is radiated to the planographic printing plate precursor is preferably from 10 to 500 mJ/cm$^2$. When the energy is in this range, an effect of suppressing a laser ablation can be obtained at higher level.

Development Step

After the light exposure step, the planographic printing plate precursor according to the invention is subjected to a development treatment using an alkali developer. Although the development treatment may be carried out immediately after the exposure, a heat treatment may be carried out between the exposure step and the development step. When the heat treatment is carried out, the heat treatment is preferably carried out in a temperature range of from 60° C. to 150° C. for 5 seconds to 5 minutes. Conventionally known various methods may be used for heating. Examples of the heating method include a method in which a recording material is heated as it is in contact with a panel heater or a ceramic heater, and a non-contact method using a lamp or hot air. This heat treatment enables the laser energy required for recording to be reduced upon laser irradiation.

Any conventionally known aqueous alkali solution may be used as a developer and a replenish solution to be used for making the planographic printing plate precursor of the invention.

The developer which may be applied to the developing process of the planographic printing plate of the invention is an aqueous alkali solution having a pH of from 9.0 to 14.0 and preferably having a pH of from 12.0 to 13.5, and substantially containing no organic solvent, and the developer containing (C) the specific ammonium salt compound described below is used. As used herein, the expression "substantially containing no organic solvent" means that an organic solvent is not contained to the level at which inconvenience is caused in terms of environmental hygiene, safety, and workability or the like. In the present specification, it indicates more specifically that the ratio of an organic solvent in a developer is 0.5% by mass or less, preferably 0.3% by mass or less, and most preferably it is not contained at all.

The developer (the replenish solution is hereinafter also referred to as a developer) used in the invention is a conventionally known aqueous alkali solution, and a developer containing (C) the specific ammonium compound that is described below is used.

Examples of the alkali agent used for preparation of an aqueous alkali solution (that is, alkali developer) include inorganic alkaline salts such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide.

Exemplary organic alkali agents include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These aqueous alkali agents may be used either singly alone or in combination of two or more thereof in the alkali developer.

Further, an aqueous alkali solution containing a non-reducing sugar and a base may be used as the developer. The non-reducing sugar belongs to sugars which do not have free aldehyde groups or ketone groups and exhibit a non-reducing property; these sugars are classified into trehalose-type oligosaccharides in which reducing groups are bonded to each other, glucosides in which reducing group of sugars and non-sugar material are bonded to each other, and sugar alcohols formed by reducing sugars with hydrogenation, each of which can be used suitably in the present invention.

Examples of the trehalose type oligosaccharides include saccharose and trehalose. Examples of the glucosides include alkylglucosides, phenolglucosides, and mustard seed oil glucoside. Examples of the sugar alcohols include D,L-arabitol, ribitol, xylitol, D,L-sorbitol, D,L-mannitol, D,L-iditol, D,L-talitol, dulcitol, and allodulcitol. Furthermore, maltitol, obtained by hydrogenating maltose that is a disaccharide, and a reduced product obtained by hydrogenating an oligosaccharide (that is, reduced starch syrup) are preferable. Of these examples, sugar alcohol and saccharose are more preferable as a non-reducing sugar. D-sorbitol, saccharose, and reduced starch syrup are even more preferable since they have a buffering effect within an appropriate pH range and are inexpensive.

The non-reducing sugars may be used singly or in combination of two or more thereof. The ratio (i.e., total ratio) of the non-reducing sugar(s) in the developer is preferably from 0.1 to 30% by mass, and more preferably from 1 to 20% by mass.

The base which may be used in combination with the non-reducing sugar(s) may be a conventionally known alkali agent. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate or ammonium borate. Furthermore, an organic alkali agent such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, or pyridine may be used.

The bases may be used either singly or in combination of two or more thereof. Among the bases, sodium hydroxide or potassium hydroxide is preferred. In the present invention, instead of the combined use of the non-reducing sugar and the base, it is possible to use a non-silicate developer whose main component is an alkaline metal salt of a non-reducing sugar.

The alkali agents may be used either singly or in combination of two or more thereof. Among them, sodium hydroxide or potassium hydroxide is preferred, because by adjusting the addition amount relative to non-reducing sugar, pH is controlled in broad pH range. Further, trisodium phosphate, sodium carbonate, potassium carbonate, or the like are also preferable as they have a buffering activity on their own.

The developer according to the invention contains (C) at least one ammonium compound selected from the group consisting of a compound represented by the following Formula (C-1), a compound represented by the following Formula (C-2), and a compound represented by the following Formula (C-3).

(C-1)

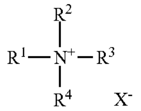

(C-2)

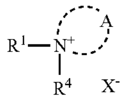

(C-3)

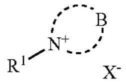

In Formula (C-1), $R^1$ represents a methyl group or an ethyl group; $R^2$ and $R^3$ each independently represent a hydrocarbon group having 3 to 20 carbon atoms; and $R^4$ represents a hydrocarbon group.

In Formula (C-2), $R^1$ represents a methyl group or an ethyl group; A represents an atomic group which forms a nitrogen-containing aliphatic ring with the $N^+$in Formula (C-2); $R^4$ represents a hydrocarbon group; and $X^-$ represents a counter anion.

In Formula (C-3), $R^1$ represents a methyl group or an ethyl group; B represents an atomic group which forms a nitrogen-containing aromatic ring with the $N^+$in Formula (C-3); and $X^-$represents a counter anion.

In Formula (C-1), $R^1$ represents a methyl group or an ethyl group, and preferably represents a methyl group. Preferred examples of the hydrocarbon group having from 3 to 20 carbon atoms which is represented by $R^2$ or $R^3$ include a linear or branched alkyl group having 3 to 20 carbon atoms, a cyclic alkyl group having 3 to 20 carbon atoms, an aryl group having 3 to 20 carbon atoms, and a substituent group which is obtained by combining two or more of these groups and has 3 to 20 total carbon atoms. More preferred examples thereof include a linear alkyl group having 3 to 20 carbon atoms, a benzyl group, a phenyl group, and a cyclohexyl group. Further, preferred examples of the hydrocarbon group represented by $R^4$ include a linear or branched alkyl group having 3 to 20 carbon atoms. More preferred examples thereof include a linear alkyl group having 3 to 12 carbon atoms.

Examples of the counter anion expressed by $X^-$include a halogen ion such as a chlorine ion, a bromine ion, a fluorine ion, or an iodine ion, and a hydroxide ion. Of these, a counter anion selected from the group consisting of a chlorine ion, a bromine ion, and a hydroxide ion is preferable.

In Formula (C-2), A represents an atomic group which forms a nitrogen-containing aliphatic ring with the $N^+$ in Formula (C-2), and the nitrogen-containing aliphatic ring is preferably a 5-membered or 6-membered saturated hydrocarbon ring which may additionally contains a heteroatom such as —O—, or —NH—. The nitrogen-containing aliphatic ring formed by A and $N^+$may additionally have one or more substituent groups, and examples of the substituent group include a linear or branched alkyl group.

In Formula (C-2), $R^1$ and $X^-$each have the same definitions as defined in Formula (C-1), and the preferred examples are also the same.

In Formula (C-3), B represents an atomic group which forms a nitrogen-containing aromatic ring with the $N^+$in Formula (C-3), and it is particularly preferable that the nitrogen-containing aromatic ring is a 6-membered aromatic ring. The nitrogen-containing aromatic ring formed by A and $N^+$may additionally have one or more substituent groups, and examples of the substituent group include a linear or branched alkyl group. The substituent group is preferably introduced at the p-position or o-position relative to the nitrogen atom.

In Formula (C-3), $R^1$ and $X^-$each have the same definitions as defined in Formula (C-1), and the preferred examples are also the same.

Hereinbelow, examples of the partial structure of an ammonium cation in (C) the specific ammonium salt compound, which is used for the alkali developer according to the invention, is described.

The (C) specific ammonium salt compound according to the invention includes the ammonium cation exemplified below and a counter anion selected from the group consisting of a halogen ion such as a chlorine ion, a bromine ion, a fluorine ion, or an iodine ion and a hydroxide ion. However, the invention is not limited to the specific examples given below.

First, examples of the ammonium cation in a compound represented by Formula (C-1) are given below.

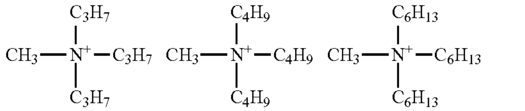
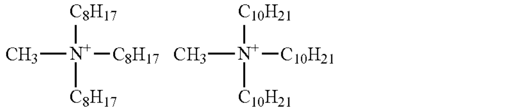
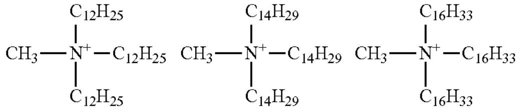
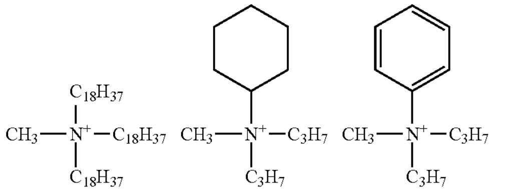
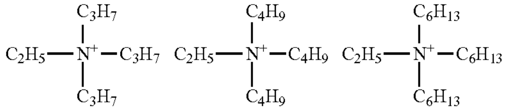

-continued

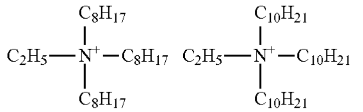
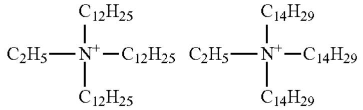
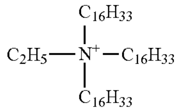
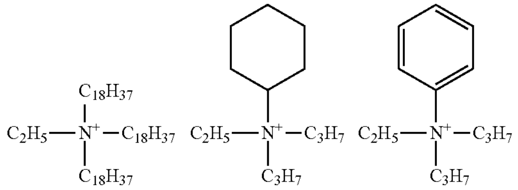

Next, examples of the ammonium cation in a compound represented by Formula (C-2) are given below.

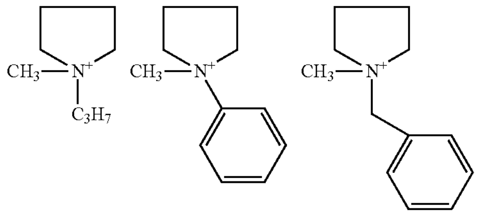
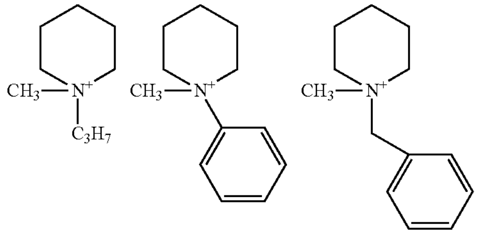
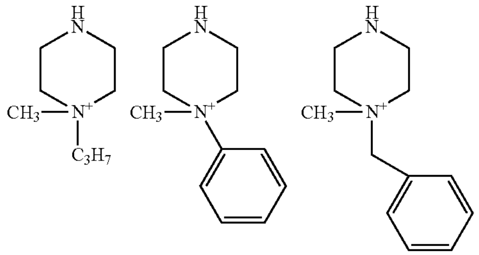
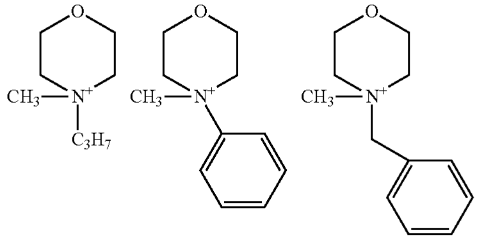

-continued

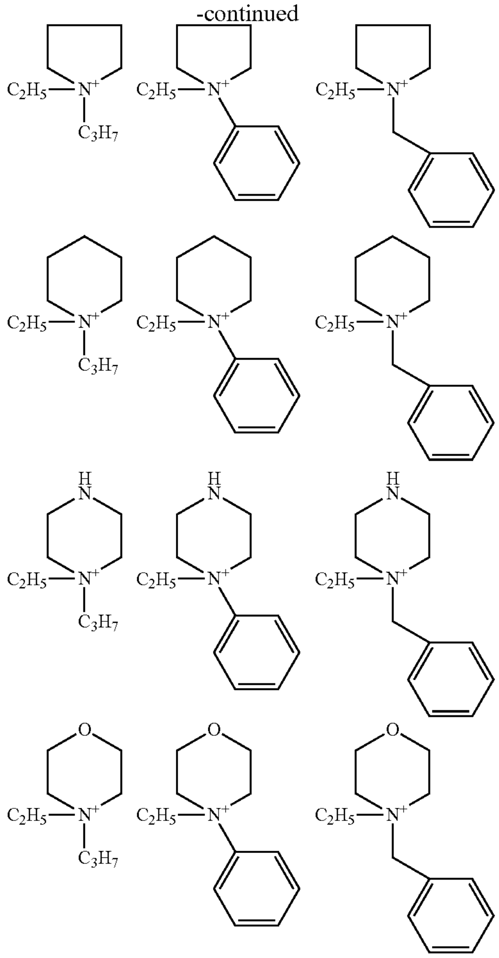

Further, examples of the ammonium cation in a compound represented by Formula (C-3) are given below.

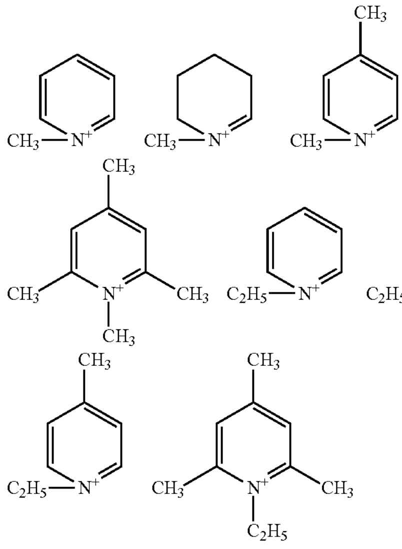

(C) The specific ammonium salt compound may be contained either singly, or in combination of two or more thereof in an alkali developer.

As for the addition amount of (C) the specific ammonium salt compound, (C) the ammonium compound is preferably contained in the range of from 1 mg to 10 g, more preferably from 2 mg to 5 g, and still more preferably in the range of from 5 mg to 1 g, with respect to one liter of an alkali developer. When the addition amount is within the above ranges, sufficient resistance of an image area to a developer is obtained, and an occurrence of contamination caused by decreased developability in an exposed region (that is, non-image area) is effectively inhibited.

In a case of carrying out development using an automatic developing apparatus, it is known that a large quantity of PS plates can be treated without replacing the developer in a development tank for a long duration by adding, to the developer, an aqueous solution (a replenish solution) having a higher alkalinity than that of the developer. In the present invention, this replenishing method is preferably employed and, as a developer and a replenish solution, it is necessary to use those containing (C) the specific ammonium salt compound described above.

To promote or suppress the developability and improve the dispersion of development scum and affinity of the image forming area of the printing plate to ink, a variety of surfactants and organic solvents may be added to the alkali developer if necessary. As for the replenish solution, those having the same formulation as the developer may be used, and those having a higher pH than that of the developer, that is, an aqueous alkali solution, may be used.

Preferred examples of the surfactants that are used in the developer or replenish solution include an anionic surfactant, a cationic surfactant, a nonionic surfactant and an amphoteric surfactant. Among these, a surfactant selected from the group consisting of an anionic surfactant, a nonionic surfactant and an amphoteric surfactant is preferable. An anionic surfactant is most preferable.

Among the anionic surfactants, an anionic surfactant having a sulfonic acid salt structure, a carboxylic acid salt structure, or a phosphoric acid salt structure is preferable.

If necessary, the developer or the replenish solution may further include, if necessary: a reducing agent such as hydroquinone, resorcin, a sodium or potassium salt of an inorganic acid such as sulfurous acid or sulfurous hydrogen acid, an organic carboxylic acid, a defoaming agent or a water softener. The printing plate which has been developed using the developer and replenish solution is subsequently subjected to a post-treatment with washing water, a rinse solution containing a surfactant and other ingredients, and/or a desensitizing solution containing gum arabic and a starch derivative. When the planographic printing plate precursor of the invention is used as a printing plate, these treatments may be employed in various combinations for the post-treatment.

In recent years, automatic developing apparatuses for printing plates have been widely used in order to rationalize and standardize plate-making processes in the plate-making and printing industries. These automatic developing apparatuses are generally made up of a development section and a post-treatment section, and include a device for transporting printing plates, various treating solution tanks, and spray devices. These apparatuses are those for developing an exposed printing plate by spraying respective treating solutions which were pumped up, onto the exposed printing plate through spray nozzles while the printing plate is being transported horizontally. Recently, a method has also attracted attention in which a printing plate is immersed in treating solution tanks filled with treating solutions and transported by means of in-liquid guide rolls. Such automatic processing may be performed while replenish solutions are being added to the respective treating solutions in accordance with the amounts to be treated, operating times, and other factors. A so-called disposable system may also be applied in which treatments are substantially conducted with the use of unused treating solutions.

After the development step, it is possible to carry out a washing treatment, a rinse treatment, or the like.

In cases where unnecessary image areas (for example, film edge traces of an original image film, and the like) are present on a planographic printing plate obtained after the development treatment, the unnecessary image areas are removed. The removal is preferably performed by a method as described in, for example, Japanese Patent Application Publication (JP-B) No. 2-13293 which involves applying an removing solution to the unnecessary image areas, allowing to stand the printing plate for a given period of time, and washing the plate with water. This removal may also be performed by a method as described in Japanese Patent Application Laid-Open (JP-A) No. 5-174842 which involves irradiating the unnecessary image areas with actinic rays guided through optical fibers, and then developing the plate.

The planographic printing plate obtained as described above may be subjected to a printing step after being coated with a desensitizing gum as desired. In order to obtain a planographic printing plate having a higher printing durability (i.e., a longer press life), a burning treatment may be applied.

A burning treatment of the planographic printing plate is preferably carried out by a treatment with a surface conditioning solution as described in Japanese Patent Application Publication (JP-B) Nos. 61-2518, 55-28062, Japanese Patent Application Laid-Open (JP-A) Nos. 62-31859 or 61-159655.

Examples of the method of the surface conditioning treatment include: a method which involves applying the surface conditioning solution onto the planographic printing plate using a sponge or absorbent cotton smeared with the solution; a method which involves immersing the planographic printing plate in a vat filled with the surface conditioning solution; and a method which involves applying the surface conditioning solution to the planographic printing plate with an automatic coater. When the amount of solution applied is made uniform with a squeegee or a squeegee roller after the solution is applied, a better result is obtained.

In general, the amount of the surface conditioning solution to be applied is suitably from 0.03 $g/m^2$ to 0.8 $g/m^2$ (dry weight). The planographic printing plate onto which the surface conditioning solution is applied is heated to a high temperature in a burning processor (for example, burning processor BP-1300 available from FUJIFILM Corporation) or the like after being dried if necessary. In this case, the heating temperature and the heating time, which may depend on the kind of ingredients forming the image, are preferably from 180° C. to 300° C. and from 1 minute to 20 minutes.

According to the method for producing a planographic printing plate of the invention, a burning treatment may be carried out after producing the plate. As a result, the recording layer of the obtained planographic printing plate has improved strength, yielding even higher wear resistance.

If necessary, the burned planographic printing plate may be appropriately subjected to conventional treatments such as washing with water or gum coating. However, in cases where a surface conditioning solution containing a water-soluble polymer compound or the like is used, the so-called desensitizing treatment such as gum coating may be omitted.

The planographic printing plate obtained after the foregoing production method is mounted on an offset printing press or the like and used to print a large number of impressions.

EXAMPLES

The invention will be described below in detail by way of examples. However, the invention should not be construed as being limited to the following examples.

Production of Support

By using an aluminum plate (according to JIS A1050) having a thickness of 0.3 mm, a combination of the following processes was performed to produce the supports A, B, C, and D.

(a) Mechanical Roughening Treatment

The mechanical roughening treatment using a rotating roller-type nylon brush was performed while supplying an abrasive slurry in the form of a suspension (specific gravity of 1.12) of an abrasive (pumice) in water to the surface of the aluminum plate. The abrasive had an average particle size of 8 μm and a maximum particle size of 50 μm. The nylon brush was made of Nylon 6, 10, and had a bristle length of 45 mm and a bristle diameter of 0.3 mm. The nylon brush was constructed of a ϕ 300 mm diameter stainless steel cylinder in which holes had been formed and bristles densely set. Three rotating brushes were used. Two support rollers (ϕ 200 mm) were provided below each brush and spaced 300 mm apart. The brush rollers were pressed against the aluminum plate until the load on the driving motor that rotates the brushes was 7 kW greater than before the brush rollers were pressed against the plate. The direction in which the brushes were rotated was the same as the direction in which the aluminum plate was moved. The speed of rotation of the brushes was 200 rpm.

(b) Alkali Etching Treatment

The aluminum plate thus obtained was subjected to an etching treatment by spraying with an aqueous solution having a sodium hydroxide concentration of 26% by mass, an aluminum ion concentration of 6.5% by mass and a temperature of 70° C. so as to dissolve 6 $g/m^2$ of the aluminum plate. The plate was then rinsed by spraying with well water.

(c) Desmutting Treatment

A desmutting treatment was carried out by spraying the plate with an aqueous nitric acid solution (concentration: 1% by mass) having a temperature of 30° C. and an aluminum ion concentration of 0.5% by mass from a spray line, and the plate was then rinsed by spraying with water. As for the aqueous nitric acid solution used for the desmutting treatment, a waste liquid which has been obtained from a process of electrochemical roughening in an aqueous nitric acid solution using an alternating current was used.

(d) Electrochemical Roughening Treatment

An electrochemical roughening treatment was consecutively carried out using a 60 Hz AC voltage. At this time, the electrolytic solution was an aqueous solution containing 10.5 g/L of nitric acid (5 g/L of aluminum ions), and had a solution temperature of 50° C. As for the alternating current waveform, an alternating current having a trapezoidal waveform which has a period of time TP from current value of zero till the current reached a peak from zero of 0.8 msec. and a duty ratio of 1:1 was used. In addition, a carbon electrode was used as the counter electrode for electrochemical roughening treatment. A ferrite was used for the auxiliary anode. A radial cell type electrolytic bath was used.

The current density at the current peak was 30 $A/dm^2$. The amount of electricity, which is the total amount of electricity when the aluminum plate serves as an anode, was 220 $C/dm^2$. 5% of the current that flows from the power supply was diverted to the auxiliary anode.

After that, the plate was rinsed by spraying with well water.

(e) Alkali Etching Treatment

The aluminum plate was subjected to an etching treatment by spraying with an aqueous solution having a sodium hydroxide concentration of 26% by mass and an aluminum ion concentration of 6.5% by mass at a temperature of 32° C. so as to dissolve 3.4 g/m$^2$ of the aluminum plate. The aluminum hydroxide-based smut ingredient generated by performing the electrochemical roughening treatment using alternating current as described in the previous step was removed and also the edge parts of the pits formed thus were dissolved and thereby smoothened. The plate was then rinsed by spraying with well water.

(f) Desmutting Treatment

A desmutting treatment was carried out by spraying the plate with an aqueous nitric acid solution (concentration: 15% by mass) having a temperature of 30° C. and an aluminum ion concentration of 4.5% by mass and the plate was then rinsed by spraying with well water. As for the aqueous nitric acid solution used for the desmutting treatment, a waste liquid which has been obtained from a process of electrochemical roughening in an aqueous nitric acid solution using an alternating current was used.

(g) Electrochemical Roughening Treatment

An electrochemical roughening treatment was consecutively carried out using a 60 Hz AC voltage. At this time, the electrolytic solution was an aqueous solution containing 7.5 g/L of hydrochloric acid and 5 g/L of aluminum ions, and had a solution temperature of 35° C. The alternating current waveform was a trapezoidal waveform, and a carbon electrode was used as the counter electrode for electrochemical roughening treatment. A ferrite was used for the auxiliary anode. A radial cell type electrolytic bath was used.

The current density at the current peak was 25 A/dm$^2$. The amount of electricity, which is the total amount of electricity when the aluminum plate serves as an anode, was 50 C/dm$^2$.

After that, the plate was rinsed by spraying with well water.

(h) Alkali Etching Treatment

The aluminum plate was subjected to an etching treatment by spraying with an aqueous solution having a sodium hydroxide concentration of 26% by mass and an aluminum ion concentration of 6.5% by mass at a temperature of 32° C. so as to dissolve 0.10 g/m$^2$ of the aluminum plate. The aluminum hydroxide-based smut ingredient generated by performing the electrochemical roughening treatment using alternating current as described in the previous step was removed and the edge parts of the pits formed were dissolved and thereby smoothed. The plate was then rinsed by spraying with well water.

(i) Desmutting Treatment

A desmutting treatment was carried out by spraying the plate with an aqueous sulfuric acid solution (concentration: 25% by mass) having a temperature of 60° C. and an aluminum ion concentration of 0.5% by mass and the plate was then rinsed by spraying with well water.

(j) Anodic Oxidation Treatment

Sulfuric acid was used for the electrolytic solution. Each electrolytic solution contained 170 g/L of sulfuric acid and 0.5% by mass of aluminum ions and had a temperature of 43° C. The plate was then rinsed by spraying with well water.

The electricity density was about 30 A/dm$^2$ for all and the final amount of the oxidized coating film was 2.7 g/m$^2$.

The support was produced as described above. Subsequently, the support was subjected to the following hydrophilization treatment and undercoat layer formation treatment.

(k) Treatment with Alkali Metal Silicate

For the alkali metal silicate treatment (that is, silicate treatment), the aluminum support obtained by an anodic oxidation treatment was impregnated by 10 seconds of immersion in a treatment tank containing a 1% by mass aqueous solution of No. 3 sodium silicate at a solution temperature of 30° C. The support was then rinsed by spraying with well water. At that time, the adhesion amount of silicate was 3.6 mg/m$^2$.

Formation of Undercoat Layer

Then, an undercoat layer-forming liquid having the composition indicated below was applied onto each aluminum support obtained after the alkali metal silicate treatment as described above. After drying for 15 seconds at 80° C., a coating film was formed to obtain the support [A]. The coating amount of the coating layer (undercoat layer) after drying was 15 mg/m$^2$.

Composition of Undercoat Layer-Forming Liquid

| | | |
|---|---|---|
| Polymer compound 1 to be disclosed below | 0.3 | g |
| Methanol | 100 | g |
| Water | 1 | g |

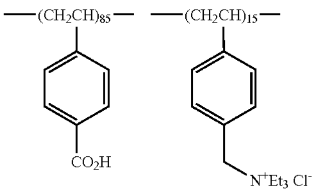

Weight average molecular weight: 28,000

Formation of Positive-Working Recording Layer

On the thus-obtained support [A], a coating liquid for forming a lower recording layer (i.e., a lower recording layer coating liquid) was applied using a wire bar coater and then dried in a drying oven at a temperature of 150° C. for 60 seconds such that the amount of the coated composition became 0.85 g/m$^2$, thereby forming a lower recording layer. After that, an upper recording layer coating liquid was applied immediately using a wire bar coater, thereby forming an upper layer. After the coating, a drying process was carried out at a temperature of 145° C. for 70 seconds and the total amount of the applied coating compositions of the lower recording layer and the upper recording layer was adjusted to 1.15 g/m$^2$, thereby obtaining the planographic printing plate precursor according to the invention and a planographic printing plate precursor as a comparative product.

Coating Liquid for Lower Recording Layer

| | | |
|---|---|---|
| Copolymer 1 (as synthesized below) | 2.133 | g |
| Cyanine dye A (having the following structure) | 0.098 | g |
| 2-Mercapto-5-methylthio-1,3,4-thiadiazole | 0.030 | g |
| Cis-$\Delta^4$-tetrahydrophthalic acid anhydride | 0.100 | g |
| 4,4'-Sulfonyl diphenol | 0.090 | g |
| p-Toluene sulfonic acid | 0.008 | g |
| Ethyl violet with the counter anion replaced with 6-hydroxy naphthalene sulfonic acid | 0.100 | g |
| 3-Methoxy-4-diazodiphenylamine hexafluorophosphate | 0.030 | g |
| Fluorine-containing surfactant (MEGAFAC F-780, manufactured by DIC) | 0.035 | g |
| Methyl ethyl ketone | 26.6 | g |
| 1-Methoxy-2-propanol | 13.6 | g |
| γ-Butyrolactone | 13.8 | g |

-continued

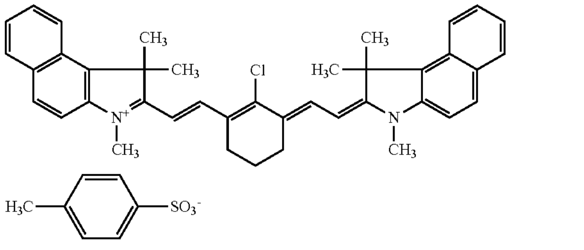

Cyanine dye A

Synthesis of Copolymer 1

To a 500-ml three-necked flask equipped with a stirrer, a condenser, and a dropping funnel, 31.0 g (0.36 mol) of methacrylic acid, 39.1 g (0.36 mol) of ethyl chloroformate, and 200 ml of acetonitrile were added, and the mixture was stirred under cooling in an ice bath. To the mixture, 36.4 g (0.36 mol) of triethylamine was added over about one hour using the dropping funnel. Once the dropwise addition is completed, the ice bath was removed and the mixture was stirred for 30 minutes at room temperature.

To the reaction mixture, 51.7 g (0.30 mol) of p-aminobenzene sulfonamide was added and, under heating using an oil bath at 70° C., the mixture was stirred for one hour. After completion of the reaction, the mixture was added to one liter of water while stirring the water. The resulting mixture was stirred for 30 minutes. The mixture was then filtered to collect the filtrates, which were then turned into a slurry using 500 ml of water. The resulting slurry was filtered and the obtained solid was dried, thereby to obtain N-(p-aminosulfonylphenyl) methacrylamide as a white solid (yield: 46.9 g).

Next, to a 20 ml three-necked flask equipped with a stirrer, a condenser, and a dropping funnel, 4.61 g (0.0192 mol) of N-(p-aminosulfonylphenyl) methacrylamide, 2.58 g (0.0258 mol) of ethyl methacrylate, 0.80 g (0.015 mol) of acrylonitrile, and 20 g of N,N-dimethyl acetamide were added, and the mixture was stirred under heating by using a hot water bath at 65° C. To the mixture, as a polymerization initiator, 0.15 g of 2,2'-azobis(2,4-dimethylvaleronitrile) (trade name: V-65, manufactured by Wako Pure Chemical Industries, Ltd.) was added and the mixture was stirred for 2 hours under nitrogen stream while maintaining at 65° C. To the reaction mixture, a mixture containing 4.61 g of N-(p-aminosulfonylphenyl) methacrylamide, 2.58 g of methyl methacrylate, 0.80 g of acrylonitrile, 20 g of N,N-dimethyl acetamide, and 0.15 g of V-65 was further added over two hours using the dropping funnel. Once the dropwise addition is completed, the mixture was stirred for two hours at 65° C. After completion of the reaction, 40 g of methanol was added to the mixture followed by cooling. The resulting mixture was added to 2 liters of water while stirring the water. After stirring the mixture for 30 minutes, the precipitates were collected by filtration followed by drying, to thereby obtain 15 g of a white solid. The weight average molecular weight of the specific copolymer 1 was measured by gel permeation chromatography (using polystyrene as a standard), and was 54,000.

Coating Liquid for Upper Recording Layer

| | |
|---|---|
| Copolymer of ethyl methacrylate and 2-methacryloyl oxyethyl succinate (molar ratio 67:33, weight average molecular weight 92,000) | 0.030 g |
| Novolac resin P1: phenol cresol-formaldehyde Novolac (phenol:m-cresol:p-cresol = 30:30:40, weight | 0.300 g |

-continued

| | |
|---|---|
| average molecular weight: 5500) | |
| Sulfonium salt (with the following structure) | 0.1 g |
| Cyanine dye A (with the aforementioned structure) | 0.015 g |
| Ethyl violet with the counter anion replaced with 6-hydroxy naphthalene sulfonic acid | 0.100 g |
| Fluorine-containing surfactant (MEGAFAC F-780, manufactured by DIC) | 0.011 g |
| Methyl ethyl ketone | 13.1 g |
| 1-Methoxy-2-propanol | 6.79 g |
| (B) Specific alkali-soluble polymer compound according to the invention or comparative resin (the compound described in Table 1) | 0.055 g |

Further, the weight average molecular weight of (B) the specific polymer compound used in Examples 1 to 13, Examples 26 to 28, and Comparative Examples 1 to 7 was 38,000.

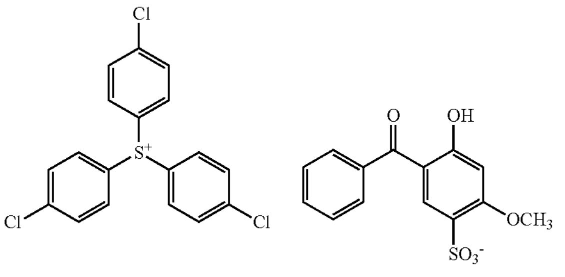

Sulfonium salt

Examples 1 to 22 and Comparative Examples 1 to 12

Production of Planographic Printing Plate

Image-wise exposure was performed on each of the thus-obtained planographic printing plate precursor using an exposure apparatus (trade name: Trend Setter 3244F manufactured by Creo Co., Ltd.) at setter exposure amount, 8.0 W, and 150 rpm (i.e., exposure process). After that, by adding (C) the specific ammonium salt compound or the comparative ammonium salt compound listed in Table 1 to Table 5 (50 mg for each) to one liter of the alkali developer having the following composition, the developer was prepared and used for the development (development process).

Composition of Alkali Developer

| | |
|---|---|
| D-sorbitol | 2.5% by mass |
| Sodium hydroxide | 0.85% by mass |
| Polyethylene glycol lauryl ether (weight average molecular weight: 1,000) | 0.5% by mass |
| Water | 96.15% by mass |

Evaluation of Planographic Printing Plate

The planographic printing plate obtained by the production method of the invention or a comparative production method was evaluated according to the following criteria, and the results are summarized in the following Table 1 to Table 5. Further, in part of the tables, results of Example 6 according to the invention, which is a standard example, are also given for comparison.

Evaluation of Solubility Discrimination

The planographic printing plate precursor obtained after exposure was impregnated in a developer. After the impregnation test, cyan concentration was measured and evaluated by using the concentration tester (trade name: SpectroEye) manufactured by GretagMacbeth.

The development completion time of an exposed region indicates the time (seconds) for the developer until cyan concentration in the recording layer becomes 0, and the concentration-decrease start completion time of an unexposed region indicates the time (seconds) till the time point at which the cyan concentration starts to decrease in the recording layer. Higher the difference between them, it is found to have better solubility discrimination. The ratio of concentration-decrease start completion time of an unexposed region compared to development completion time of an exposed region can be obtained as an index according to the following calculation method, and taken as solubility discrimination.

[(Concentration−decrease start completion time of an unexposed region)/(Development completion time of an exposed region)]=Solubility discrimination.

When it is 5 or higher, it indicates extremely excellent solubility discrimination. When it is 4 or higher, it indicates excellent level. When it is less than 3, it corresponds to a practically problematic level.

Evaluation of Scratch Resistance

Each planographic printing plate precursor having the upper recording layer described in the following table was abraded fifteen times with type CS5 abraser felt using a rotary abrasion tester (Toyo Seiki Seisaku-sho, Ltd.) with a load of 250 g.

Next, the planographic printing plate precursor was subjected to the development treatment in the same manner as the aforementioned method for producing a planographic printing plate except that the developer added with (C) the specific ammonium salt compound or the comparative ammonium salt compound, or not added with the ammonium salt compound is used as a developer described in the table. The planographic printing plate obtained accordingly was subjected to measurement of cyan concentration on the plate surface using the concentration tester manufactured by GretagMacbeth, specifically for the portion applied with abrasion and the portion not applied with abrasion. The absolute value of the difference between them was calculated. Higher the value, it indicates greater damage on the plate surface as caused by abrasion. A value that is 0.02 or lower indicates a practically allowable scratch resistance.

TABLE 1

| | | Alkali-soluble resin included in upper recording layer | | |
|---|---|---|---|---|
| | Developer Specific ammonium salt | (b-1) Repeating unit | (b-2) Repeating unit having alkali soluble group | Planographic printing plate precursor |
| Example 1 | 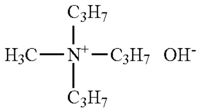 | 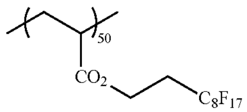 | 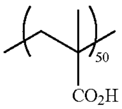 | Present invention |
| Example 2 | 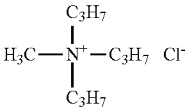 | Same as above | Same as above | Present invention |
| Example 3 | 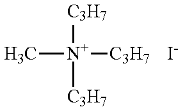 | Same as above | Same as above | Present invention |
| Example 4 | 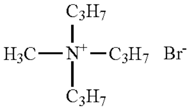 | Same as above | Same as above | Present invention |
| Example 5 | 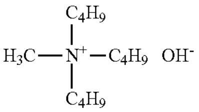 | Same as above | Same as above | Present invention |
| Example 6 | 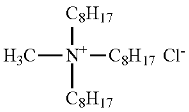 | Same as above | Same as above | Present invention |
| Example 7 | 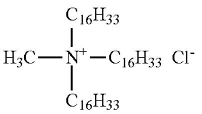 | Same as above | Same as above | Present invention |

TABLE 1-continued

| | | | | |
|---|---|---|---|---|
| Example 8 | 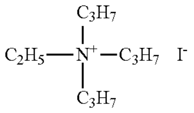 | Same as above | Same as above | Present invention |
| Example 9 | 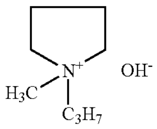 | Same as above | Same as above | Present invention |
| Example 10 | 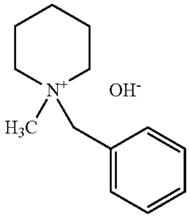 | Same as above | Same as above | Present invention |

| | Development completion time of exposed region (seconds) | Concentration-decrease start time of unexposed region (seconds) | Solubility discrimination | Scratch resistance of image area Concentration decrease in image area |
|---|---|---|---|---|
| Example 1 | 10 | 45 | 4.5 | 0.01 |
| Example 2 | 10 | 45 | 4.5 | 0.01 |
| Example 3 | 10 | 45 | 4.5 | 0.01 |
| Example 4 | 10 | 45 | 4.5 | 0.01 |
| Example 5 | 10 | 50 | 5.0 | 0.00 |
| Example 6 | 10 | 50 | 5.0 | 0.00 |
| Example 7 | 10 | 50 | 5.0 | 0.00 |
| Example 8 | 10 | 45 | 4.5 | 0.01 |
| Example 9 | 10 | 50 | 5.0 | 0.00 |
| Example 10 | 10 | 50 | 5.0 | 0.00 |

TABLE 2

| | Developer | Alkali-soluble resin included in upper recording layer | | Planographic |
|---|---|---|---|---|
| | Specific ammonium salt or Comparative ammonium salt | (b-1) Repeating unit | (b-2) Repeating unit having alkali soluble group | printing plate precursor |
| Example 11 | 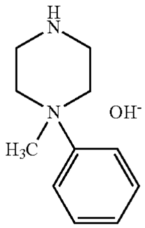 | 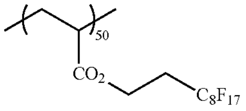 | 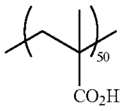 | Present invention |
| Example 12 | 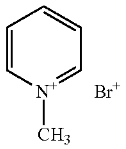 | Same as above | Same as above | Present invention |

TABLE 2-continued

| | | | | |
|---|---|---|---|---|
| Example 13 | 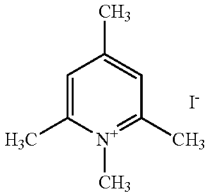 | Same as above | Same as above | Present invention |
| Comparative Example 1 | 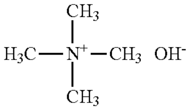 | Same as above | Same as above | Present invention |
| Comparative Example 2 | 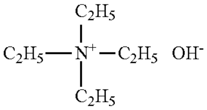 | Same as above | Same as above | Present invention |
| Comparative Example 3 | 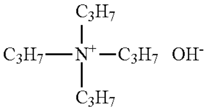 | Same as above | Same as above | Present invention |
| Comparative Example 4 | 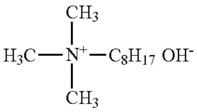 | Same as above | Same as above | Present invention |
| Comparative Example 5 | 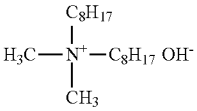 | Same as above | Same as above | Present invention |
| Comparative Example 6 | 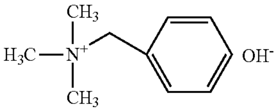 | Same as above | Same as above | Present invention |
| Comparative Example 7 | 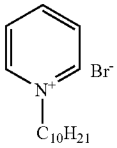 | Same as above | Same as above | Present invention |

| | Development completion time of exposed region (seconds) | Concentration-decrease start time of unexposed region (seconds) | Solubility discrimination | Scratch resistance of image area Concentration decrease in image area |
|---|---|---|---|---|
| Example 11 | 10 | 50 | 5.0 | 0.00 |
| Example 12 | 10 | 45 | 4.5 | 0.01 |
| Example 13 | 10 | 50 | 5.0 | 0.00 |
| Comparative Example 1 | 10 | 30 | 3.0 | 0.05 |
| Comparative Example 2 | 10 | 30 | 3.0 | 0.05 |
| Comparative Example 3 | 10 | 30 | 3.0 | 0.05 |
| Comparative Example 4 | 10 | 30 | 3.0 | 0.05 |
| Comparative Example 5 | 10 | 35 | 3.5 | 0.04 |
| Comparative Example 6 | 10 | 35 | 3.5 | 0.04 |
| Comparative Example 7 | 10 | 30 | 3.0 | 0.05 |

TABLE 3

| | | Alkali soluble resin included in the recording layer | | | |
|---|---|---|---|---|---|
| | Developer Specific ammonium salt | (b-1) Repeating unit | (b-2) Repeating unit having alkali soluble group | Mw | Planographic printing plate precursor |
| Example 6 | 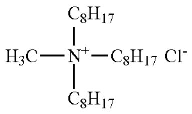 | 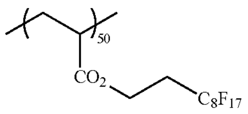 | 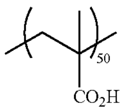 | 38,000 | Present invention |
| Example 14 | Same as above | 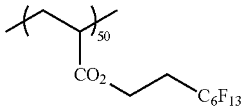 | Same as above | 56,000 | Present invention |
| Example 15 | Same as above | 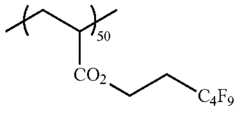 | Same as above | 48,000 | Present invention |
| Example 16 | Same as above | 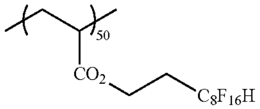 | Same as above | 32,000 | Present invention |
| Example 17 | Same as above | 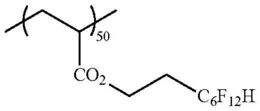 | Same as above | 70,000 | Present invention |
| Example 18 | Same as above | 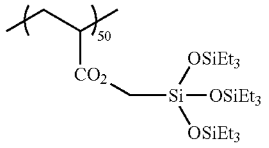 | Same as above | 52,000 | Present invention |
| Example 19 | Same as above | 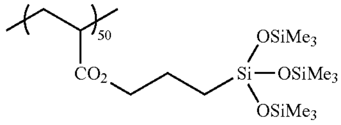 | Same as above | 54,000 | Present invention |
| Example 20 | Same as above | 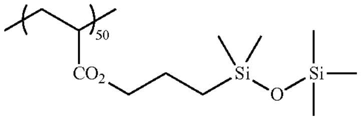 | Same as above | 38,000 | Present invention |
| Example 21 | Same as above | 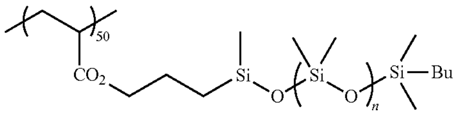 n = 8 | Same as above | 66,000 | Present invention |
| Example 22 | Same as above | 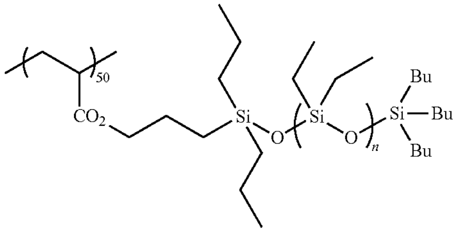 n = 8 | Same as above | 46,00 | Present invention |

TABLE 3-continued

| | Development completion time of an exposed region (seconds) | Concentration-decrease start time of an unexposed region (seconds) | Solubility discrimination | Scratch resistance of image area Concentration decrease in image area |
|---|---|---|---|---|
| Example 6 | 10 | 50 | 5.0 | 0.00 |
| Example 14 | 10 | 50 | 5.0 | 0.00 |
| Example 15 | 10 | 45 | 4.5 | 0.01 |
| Example 16 | 10 | 50 | 5.0 | 0.00 |
| Example 17 | 10 | 50 | 5.0 | 0.00 |
| Example 18 | 10 | 45 | 4.5 | 0.01 |
| Example 19 | 10 | 45 | 4.5 | 0.01 |
| Example 20 | 10 | 45 | 4.5 | 0.01 |
| Example 21 | 10 | 45 | 4.5 | 0.01 |
| Example 22 | 10 | 45 | 4.5 | 0.01 |

TABLE 4

| | | Alkali-soluble resin included in upper recording layer | | Planographic |
|---|---|---|---|---|
| | Developer Specific ammonium salt | (b-1) Repeating unit | (b-2) Repeating unit having alkali soluble group | printing plate precursor |
| Comparative Example 8 | 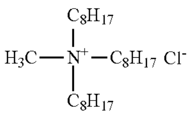 | No | 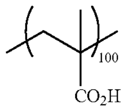 | Comparative product |
| Comparative Example 9 | Same as above | 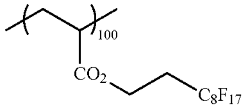 | No | Comparative product |
| Comparative Example 10 | Same as above | 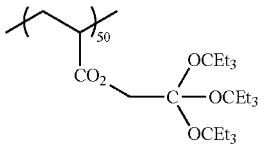 | 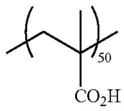 | Comparative product |
| Comparative Example 11 | Same as above | 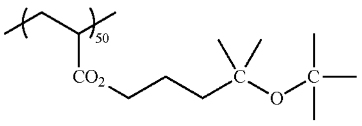 | Same as above | Comparative product |

| | Development completion time of an exposed region (seconds) | Concentration-decrease start time of an unexposed region (seconds) | Solubility discrimination | Scratch resistance of image area Concentration decrease in image area |
|---|---|---|---|---|
| Comparative Example 8 | 10 | 30 | 3.0 | 0.05 |
| Comparative Example 9 | 15 | 30 | 2.0 | 0.05 |
| Comparative Example 10 | 10 | 30 | 3.0 | 0.05 |
| Comparative Example 11 | 10 | 30 | 3.0 | 0.05 |

TABLE 5

| | Developer Specific ammonium salt | Alkali soluble resin included in upper recording layer (b-1) Repeating unit | (b-2) Repeating unit having alkali soluble group | Mw | Planographic printing plate precursor |
|---|---|---|---|---|---|
| Example 6 | 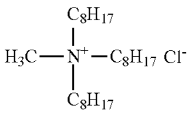 | 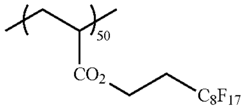 | 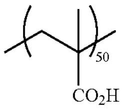 | 38,000 | Present invention |
| Example 23 | Same as above | Same as above | 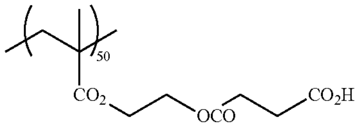 | 42,000 | Present invention |
| Example 24 | Same as above | Same as above | 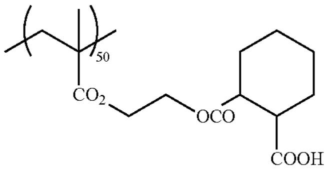 | 80,000 | Present invention |
| Example 25 | Same as above | 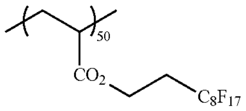 | 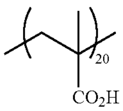 | 38,000 | Present invention |
| Comparative Example 13 | Same as above | Same as above | 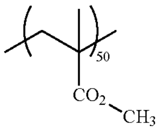 | 38,000 | Comparative product |
| Comparative Example 14 | Same as above | Same as above | 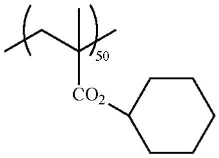 | 42,000 | Comparative product |
| Comparative Example 15 | Same as above | Same as above | 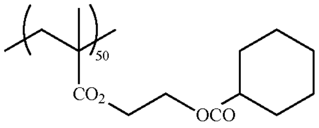 | 78,000 | Comparative product |

| | Development completion time of an exposed region (seconds) | Concentration-decrease start time of an unexposed region (seconds) | Solubility discrimination | Scratch resistance of image area Concentration decrease in image area |
|---|---|---|---|---|
| Example 6 | 10 | 50 | 5.0 | 0.00 |
| Example 23 | 10 | 50 | 5.0 | 0.00 |
| Example 24 | 10 | 50 | 5.0 | 0.00 |
| Example 25 | 10 | 50 | 5.0 | 0.00 |
| Comparative Example 13 | 10 | 30 | 3.0 | 0.05 |
| Comparative Example 14 | 10 | 30 | 3.0 | 0.05 |
| Comparative Example 15 | 10 | 30 | 3.0 | 0.05 |

As is apparent from descriptions of Table 1 to Table 5, it is found that any one of the planographic printing plate obtained by the production method of Examples 1 to 25, in which the planographic printing plate precursor having a recording layer with a multilayer structure according to the invention, which has the upper recording layer including (B) the specific alkali soluble polymer compound, is developed with an alkali developer containing (C) the specific ammonium salt compound according to the invention, has excellent solubility discrimination and the formed image area exhibited excellent scratch resistance.

Meanwhile, even when the recording layer according to the invention is included, the planographic printing plate obtained by production method of Comparative Examples 1 to 7 in which development is carried out with an alkali developer not within the range of the invention, and the planographic printing plate of Comparative Examples 6 to 15 obtained by using a planographic printing plate precursor which has a recording layer not within the range of the invention exhibited smaller solubility discrimination and the formed image area exhibited poor scratch resistance compared to Examples.

Examples 26 to 28

The planographic printing plate was produced and evaluated in the same manner as Example 6 except that content of the specific ammonium salt compound added to the alkali developer in Example 6 is changed to the amount listed in Table 6. The results are summarized in Table 6.

agent and an outermost recording layer of the at least two recording layers includes (B) a water-insoluble and alkali-soluble polymer compound that includes a repeating unit having a partial structure selected from the group consisting of a fluoroalkyl group and a siloxane structure and includes a repeating unit having an alkali-soluble group; and developing the planographic printing plate precursor after the image-wise light exposure using an alkali developer including (C) at least one ammonium salt compound selected from the group consisting of a compound represented by the following Formula (C-1), a compound represented by the following Formula (C-2), and a compound represented by the following Formula (C-3):

(C-1)

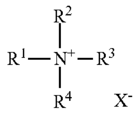

TABLE 6

| | Developer | | Alkali soluble resin included in upper recording layer | | |
|---|---|---|---|---|---|
| | Specific ammonium salt compound | Content in 1 liter alkali developer | (b-1) Repeating unit | (b-2) Repeating unit having alkali soluble group | Planographic printing plate precursor |
| Example 6 | 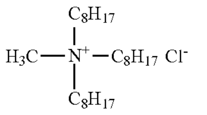 | 50 mg | 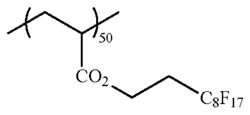 | 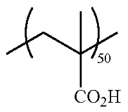 | Present invention |
| Example 26 | Same as above | 1 mg | Same as above | Same as above | Present invention |
| Example 27 | Same as above | 500 mg | Same as above | Same as above | Present invention |
| Example 28 | Same as above | 10 g | Same as above | Same as above | Present invention |

| | Development completion time of an exposed region (seconds) | Concentration-decrease start time of an unexposed region (seconds) | Solubility discrimination | Scratch resistance of image area Concentration decrease in image area |
|---|---|---|---|---|
| Example 6 | 10 | 50 | 5.0 | 0.00 |
| Example 26 | 10 | 45 | 5.0 | 0.01 |
| Example 27 | 10 | 50 | 5.0 | 0.00 |
| Example 28 | 10 | 50 | 5.0 | 0.00 |

As clearly listed in the descriptions of Table 6, even when an alkali developer having modified content of (C) the specific ammonium salt compound is used, any of the planographic printing plates obtained by the production method of Examples 26 to 28 exhibited excellent solubility discrimination and the formed image area exhibited excellent scratch resistance.

Exemplary embodiments of the present invention are described below.

(1) A method for producing a planographic printing plate, the method including, in the following order:

subjecting a planographic printing plate precursor to image-wise light exposure, the planographic printing plate precursor including: a surface-hydrophilic support; and, on the surface-hydrophilic support, at least two recording layers including an alkali-soluble polymer compound, wherein at least one layer of the at least two recording layers is a positive-working recording layer including (A) an infrared absorbing -continued (C-2)

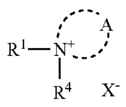

(C-3)

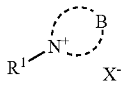

wherein, in Formula (C-1), $R^1$ represents a methyl group or an ethyl group; $R^2$ and $R^3$ each independently represent a hydrocarbon group having 3 to 20 carbon atoms; $R^4$ represents a hydrocarbon group; and $X^-$ represents a counter anion;

in Formula (C-2), $R^1$ represents a methyl group or an ethyl group; A represents an atomic group that forms a nitrogen-containing aliphatic ring together with $N^+$in Formula (C-2); $R^4$ represents a hydrocarbon group; and $X^-$represents a counter anion; and in Formula (C-3), $R^1$ represents a methyl group or an ethyl group; B represents an atomic group that forms a nitrogen-containing aromatic ring together with $N^+$in Formula (C-3); and $X^-$represents a counter anion.

(2) The method for producing a planographic printing plate according to (1), wherein the repeating unit having a partial structure including a fluoroalkyl group in the (B) water-insoluble and alkali-soluble polymer compound is a repeating unit derived from a monomer represented by the following Formula (1):

(1)

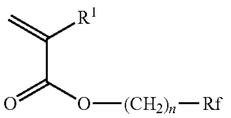

wherein, in Formula (1), Rf represents a substituent including a fluoroalkyl group having 9 or more fluorine atoms or a perfluoroalkyl group having 9 or more fluorine atoms; n represents 1 or 2; and $R^1$ represents a hydrogen atom or a methyl group.

(3) The method for producing a planographic printing plate according to (1), wherein the repeating unit having a partial structure including a siloxane structure in the (B) water-insoluble and alkali-soluble polymer compound is a repeating unit having a partial structure represented by the following Formula (2):

(2)

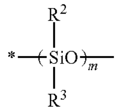

wherein, in Formula (2), $R^2$ and $R^3$ each independently represent an alkyl group or an aryl group; and m represents an integer of 1 to 500.

(4) The method for producing a planographic printing plate according to any one of (1) to (3), wherein the alkali-soluble group is a carboxyl group.

(5) The method for producing a planographic printing plate according to any one of (1) to (4), wherein $X^-$in Formulae (C-1) to (C-3) is a halogen anion or a hydroxide ion.

(6) The method for producing a planographic printing plate according to any one of (1) to (5), wherein the nitrogen-containing aliphatic ring formed by A together with $N^+$in Formula (C-2) is a 5-membered or 6-membered saturated hydrocarbon ring which may include a heteroatom.

(7) The method for producing a planographic printing plate according to any one of (1) to (5), wherein the nitrogen-containing aromatic ring formed by B together with $N^+$ in Formula (C-3) is a 6-membered nitrogen-containing aromatic ring.

(8) The method for producing a planographic printing plate according to any one of (1) to (7), wherein the alkali developer includes (C) the ammonium salt compound in an amount of from 1 mg to 10 g per one liter of the alkali developer.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a planographic printing plate, the method comprising, in the following order:

subjecting a planographic printing plate precursor to image-wise light exposure, the planographic printing plate precursor comprising: a surface-hydrophilic support; and, on the surface-hydrophilic support, at least two recording layers including an alkali-soluble polymer compound, wherein at least one layer of the at least two recording layers is a positive-working recording layer comprising (A) an infrared absorbing agent and an outermost recording layer of the at least two recording layers comprises (B) a water-insoluble and alkali-soluble polymer compound that includes a repeating unit having a partial structure selected from the group consisting of a fluoroalkyl group and a siloxane structure and includes a repeating unit having an alkali-soluble group; and developing the planographic printing plate precursor after the image-wise light exposure using an alkali developer comprising a compound represented by the following Formula (C-2):

(C-2)

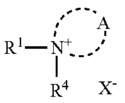

wherein, in Formula (C-2), $R^1$ represents a methyl group or an ethyl group; A represents an atomic group that forms a nitrogen-containing aliphatic ring together with $N^+$in Formula (C-2); $R^4$ represents a hydrocarbon group; and $X^-$represents a counter anion.

2. The method for producing a planographic printing plate according to claim 1, wherein the repeating unit having a partial structure comprising a fluoroalkyl group in the (B) water-insoluble and alkali-soluble polymer compound is a repeating unit derived from a monomer represented by the following Formula (1):

(1)

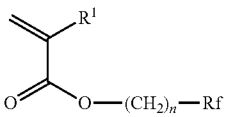

wherein, in Formula (1), Rf represents a substituent comprising a fluoroalkyl group having 9 or more fluorine atoms or a perfluoroalkyl group having 9 or more fluorine atoms; n represents 1 or 2; and $R^1$ represents a hydrogen atom or a methyl group.

3. The method for producing a planographic printing plate according to claim 1, wherein the repeating unit having a partial structure comprising a siloxane structure in the (B) water-insoluble and alkali-soluble polymer compound is a repeating unit having a partial structure represented by the following Formula (2):

(2)

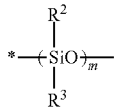

wherein, in Formula (2), $R^2$ and $R^3$ each independently represent an alkyl group or an aryl group; and m represents an integer of 1 to 500.

4. The method for producing a planographic printing plate according to claim 1, wherein the alkali-soluble group is a carboxyl group.

5. The method for producing a planographic printing plate according to claim 1, wherein $X^-$in Formula (C-2) is a halogen anion or a hydroxide ion.

6. The method for producing a planographic printing plate according to claim 1, wherein the nitrogen-containing aliphatic ring formed by A together with $N^+$in Formula (C-2) is a 5-membered or 6-membered saturated hydrocarbon ring which may include a heteroatom.

7. The method for producing a planographic printing plate according to claim 1, wherein the alkali developer comprises the compound represented by Formula (C-2) in an amount of from 1 mg to 10 g per one liter of the alkali developer.

8. the method for producing a planographic printing plate according to claim 1, wherein the repeating unit having a partial structure composing a siloxane structure in the (B) water-insoluble and alkali-soluble polymer compound is selected from the following repeating units:

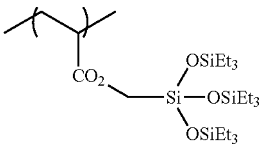

-continued

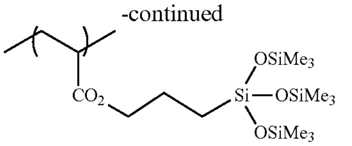

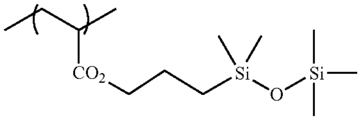

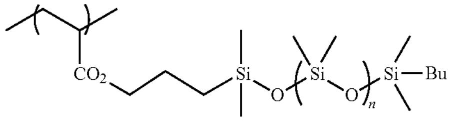

n = 8

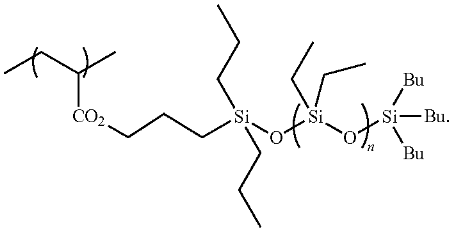

n = 8

9. The method for producing a planographic printing plate according to claim 1, wherein the hydrocarbon group represented by $R^4$ in Formula (C-2) is a linear or branched alkyl group having from 3 to 20 carbon atoms.

* * * * *